United States Patent
Matsumoto et al.

(10) Patent No.: US 9,455,822 B2
(45) Date of Patent: Sep. 27, 2016

(54) RECEIVER, TRANSMITTER, AND COMMUNICATION METHOD

(71) Applicants: MITSUBISHI ELECTRIC CORPORATION, Tokyo (JP); MITSUBISHI ELECTRIC RESEARCH LABORATORIES, INC., Cambridge, MA (US)

(72) Inventors: Wataru Matsumoto, Tokyo (JP); Toshiaki Akino, Medford, MA (US); Yoshikuni Miyata, Tokyo (JP); Kenya Sugihara, Tokyo (JP); Takashi Sugihara, Tokyo (JP); Takafumi Fujimori, Tokyo (JP)

(73) Assignees: Mitsubishi Electric Corporation, Tokyo (JP); Mitsubishi Electric Research Laboratories, Inc., Cambridge, MA (US)

( * ) Notice: Subject to any disclaimer, the term of this patent is extended or adjusted under 35 U.S.C. 154(b) by 0 days.

(21) Appl. No.: 14/417,447

(22) PCT Filed: Aug. 27, 2013

(86) PCT No.: PCT/JP2013/072897
§ 371 (c)(1),
(2) Date: Jan. 26, 2015

(87) PCT Pub. No.: WO2014/034676
PCT Pub. Date: Mar. 6, 2014

(65) Prior Publication Data
US 2015/0195081 A1    Jul. 9, 2015

(30) Foreign Application Priority Data
Aug. 31, 2012 (JP) .................... 2012-191722

(51) Int. Cl.
*H04L 27/00* (2006.01)
*H04L 7/00* (2006.01)
(Continued)

(52) U.S. Cl.
CPC ........... *H04L 7/0016* (2013.01); *H03M 13/63* (2013.01); *H04B 1/76* (2013.01); *H04L 1/005* (2013.01);
(Continued)

(58) Field of Classification Search
CPC ... H04L 7/0016; H04L 7/0079; H04L 7/033; H04B 1/76; H03M 13/63; H03M 13/45; H03M 13/1105; H03M 13/1515; H03M 13/152
See application file for complete search history.

(56) References Cited

U.S. PATENT DOCUMENTS

| | | | |
|---|---|---|---|
| 2004/0240481 A1 | 12/2004 | Matsumoto | |
| 2007/0147542 A1* | 6/2007 | Schmidt | H03M 13/251 375/298 |

(Continued)

FOREIGN PATENT DOCUMENTS

| | | |
|---|---|---|
| JP | 7 235959 | 9/1995 |
| JP | 2003 348064 | 12/2003 |

(Continued)

OTHER PUBLICATIONS

Tao, Z., et al., "Improvements to Digital Carrier Phase Recovery Algorithm for High-Performance Optical Coherent Receivers", IEEE Journal of Selected Topics in Quantum Electronics, vol. 16, No. 5, pp. 1201-1209, (Sep./Oct. 2010).

(Continued)

*Primary Examiner* — Dac Ha
(74) *Attorney, Agent, or Firm* — Oblon, McClelland, Maier & Neustadt, L.L.P

(57) ABSTRACT

A transmitter for transmitting a transmission signal subjected to modulation after error correction coding and a receiver including a phase compensation unit for receiving the transmission signal and performing demodulation therefor while maintaining synchronization thereof and an error correction decoding unit for performing decoding processing for received data that has been subjected to the demodulation. The transmitter transmits a signal formed of a plurality of pilot sequences as a part of the transmission signal, and the receiver has a phase slip estimation processing function for estimating the phase slip by the phase compensation unit by using the plurality of pilot sequences, and for estimating a phase difference component by the error correction decoding unit, to thereby correct a phase of the received data.

16 Claims, 13 Drawing Sheets

(51) Int. Cl.
    *H04B 1/76*     (2006.01)
    *H03M 13/00*     (2006.01)
    *H04L 7/033*     (2006.01)
    *H04L 1/00*     (2006.01)
    H03M 13/45     (2006.01)
    H03M 13/11     (2006.01)
    H03M 13/15     (2006.01)

(52) U.S. Cl.
    CPC .............. *H04L 7/0079* (2013.01); *H04L 7/033* (2013.01); *H03M 13/1105* (2013.01); *H03M 13/152* (2013.01); *H03M 13/1515* (2013.01); *H03M 13/45* (2013.01); *H04L 1/0057* (2013.01)

(56) References Cited

U.S. PATENT DOCUMENTS

| | | | |
|---|---|---|---|
| 2009/0175367 A1 | 7/2009 | Kishigami et al. | |
| 2009/0232257 A1* | 9/2009 | Bury | H04L 27/2672 375/341 |
| 2009/0310722 A1* | 12/2009 | Lewis | H04L 27/2657 375/344 |
| 2012/0096327 A1 | 4/2012 | Cai | |
| 2014/0169434 A1* | 6/2014 | Hewavithana | H04L 27/2647 375/232 |

FOREIGN PATENT DOCUMENTS

| | | |
|---|---|---|
| JP | 2007 67564 | 3/2007 |
| JP | 2007 67585 | 3/2007 |
| JP | 2008 502246 | 1/2008 |
| JP | 4958565 | 6/2012 |
| WO | 2006 005835 | 1/2006 |
| WO | WO 2014/023355 A1 | 2/2014 |

OTHER PUBLICATIONS

Yoshida, T., et al. "Phase-Slip Detection and Compensation by Polarization Coding on Coherent Optical Communication", Institute of Electronics, Information and Communication Engineers, p. 219, (2012).

International Search Report Issued Oct. 22, 2013 in PCT/JP13/072897 filed Aug. 27, 2013.

Extended European Search Report issued Mar. 29, 2016 in Patent Application No. 13832457.9.

* cited by examiner

NUMBER OF SYMBOLS

RECEIVER, TRANSMITTER, AND COMMUNICATION METHOD

TECHNICAL FIELD

The present invention relates to a receiver, a transmitter, and a communication method, which have achieved improvement in performance by improving a synchronization method for a communication system and an estimation method for a phase fluctuation component at a time of a differential modulation.

BACKGROUND ART

As a related-art synchronization method, a plurality of known modulated waves for synchronization, which use a training symbol within a preamble or a pilot signal, are transmitted, and the known synchronizing signals are used to maintain the synchronization. Further, when a phase fluctuation is significant, an influence of a phase fluctuation amount is reduced by a differential modulation or the like (see, for example, Patent Literature 1).

FIG. 14 is a circuit configuration diagram of a related-art optical communication system. On a transmitter side, error correction coding is performed for transmission information by a forward error correction (FEC) coding unit, and a modulated signal based on quadrature phase shift keying (QPSK) or the like is generated by an optical modulation unit, to thereby perform transmission. In this case, high-speed optical communication has such a characteristic that the phase fluctuation is large. Therefore, in general, modulation is performed by mapping information to a phase difference between symbols (units of modulated/demodulated signals) on a transmitter side, while the demodulation is performed by using differential detection, differential synchronous detection, or the like for detecting the phase difference between the received symbols on a receiver side.

For example, even when a phase fluctuates by θ during a long segment of L symbols, a fluctuation of θ/L on average suffices in a case of the differential modulation. This produces such a characteristic that stable demodulation performance can be maintained because of being rarely influenced by the phase fluctuation.

On the other hand, when the phase fluctuates linearly by θ during the long segment of L symbols in synchronous detection for performing demodulation while perfectly maintaining synchronization between symbols, assuming that the order of the symbols is expressed as i=0, 1, 2, . . . , and L−1, i-th symbol is subject to the fluctuation of a phase of i×θ/L. Therefore, an influence exerted in the phase fluctuation becomes large, and in turn the demodulation performance greatly deteriorates.

However, in regard to the demodulation performance (error ratio after demodulation) on additive Gaussian noise (AWGN) with the phase fluctuation ignored, it is known that the differential detection and the differential synchronous detection are subject to deterioration of approximately 3 dB and 1.4 dB, respectively, with a BER of equal to or smaller than 1.E−5 points after decoding or the like compared with the synchronous detection.

Next, a description is made of a general phase compensation unit. A circuit illustrated in FIG. 14 is a block diagram of a phase compensation method based on a fourth-power method. Assuming that a linear distortion and an inter-channel nonlinear distortion have been compensated, a k-th symbol in a case where a QPSK demodulator is assumed can be expressed as follows:

$$\exp(j\phi_{d,k}+j\phi_k)+n_k.$$

Here, $\phi_{d,k}$ represents a phase of a k-th piece of data, and takes any one value of $\pm\pi/4$ or $\pm 3\pi/4$. Further, $\phi_k$ represents a phase shift that occurs due to phase noise caused by a laser or a nonlinear phase shift.

Next, with reference to FIG. 14, a description is made of a phase compensation unit 100.

(1) First, the received symbol is raised to the fourth power (corresponding to reference numeral 101 in FIG. 14). Here, $\phi_{d,k}$ is any one value of $\pm\pi/4$ or $\pm 3\pi/4$, and hence the fourth power of $\exp(j\phi_{d,k})$ is always −1. As a result, a modulated data component can be removed by the fourth power calculation.

(2) Next, Gaussian noise $n_k$ can be removed by averaging (corresponding to reference numeral 102 in FIG. 14).

(3) Further, the fourth power of $\exp(j\phi_{d,k})$ is always $\exp(j4\phi_{d,k})=-1$, and hence inverse compensation (corresponding to reference numeral 103 in FIG. 14) is performed, to extract only $\exp(j4\phi_k)$ in principle.

(4) Finally, with respect to $\exp(j4\phi_k)$, an angle is extracted by a function of angle Arg( ) and divided by 4, to thereby obtain an estimated phase shift value:

$$\hat{\phi}_k \qquad [\text{Math. 1}]$$

(corresponding to reference numeral 104 in FIG. 14). The value is converted into:

$$\exp(-\hat{\phi}_k) \qquad [\text{Math. 2}]$$

(corresponding to reference numeral 105 in FIG. 14), and is multiplied by the received symbol (corresponding to reference numeral 106 in FIG. 14), to thereby remove a phase shift component.

With such operations as described above, a phase compensation circuit operates so as to allow correction based on the phase shift and reception at an appropriate signal point of the symbol. However, the fourth-power method raises a problem in that $\phi_k$ after averaging functions only when being within $\pm\pi/4$, and when there is a fluctuation exceeding this range, operates so as to be locked in a position shifted by $\pm\pi/2$ or $\pi$.

A consecutive phase shift caused in this manner when the phase is locked in a position shifted by $\pm\pi/2$ or $\pi$ (in other words, a phenomenon that a synchronization shift conspicuously occurs at $\pm\pi/2$ and $\pi$ in communications, and once synchronization is lost, a state of the synchronization shift continues) is expressed as "phase slip". Due to this phenomenon, in the case of the synchronous detection, in regard to a portion that has caused the phase slip, a burst-like error occurs, which makes it difficult for an FEC decoding unit to correct the error. Therefore, the synchronous detection using this method is difficult for an optical communication device.

On the other hand, in cases of the differential detection and the differential synchronous detection, an error caused by the phase slip is only 1 bit (when the phase slip phenomenon gradually fluctuates over a plurality of symbols in actuality, a part of the number of bits included in the fluctuated segment). Accordingly, the differential detection and the differential synchronous detection are relatively robust against the phase slip phenomenon. For such reasons as described above, an optical communication system configuration based on the differential modulation is employed for a related-art method.

CITATION LIST

Non Patent Literature

[NPL 1] Zhenning T. et al. "Improvements to Digital Carrier Phase Recovery Algorithm for High-Performance Optical Coherent Receivers", IEEE Journal of Selected Topics in Quantum Electronics, VOL. 16, No. 5, September/October 2010.

SUMMARY OF INVENTION

Technical Problem

However, the related art has such problems as described below.

There is a problem in that a phase error occurs when sufficient synchronization cannot be maintained by a preamble or a pilot signal or when there is a fluctuation after a time point at which the synchronization was achieved, which leads to deterioration in performance. Further, because synchronous detection is difficult when a phase fluctuation is significant, transmission may be performed by a differential modulation that is robust over the phase fluctuation, while differential detection may be performed on a receiving end. However, in this case, there is a problem in that an SNR to a bit error ratio (BER) after given detection exhibits deterioration of approximately 3 dB in the differential detection compared with the synchronous detection.

The present invention has been made in order to solve the above-mentioned problems, and an object thereof is to obtain a receiver, a transmitter, and a communication method, which exhibit performance close to that of synchronous detection even when a phase slip occurs.

Solution to Problem

According to one embodiment of the present invention, there is provided a receiver to be used under an environment in which a phase slip or a phase fluctuation occurs, for receiving, as a received signal, a transmission signal comprising a signal formed of a plurality of pilot sequences as a part thereof and subjected to modulation after error correction coding, the receiver including: a phase compensation unit for performing demodulation for the received signal while maintaining synchronization thereof; and an error correction decoding unit for performing decoding processing for received data that has been subjected to the demodulation, the receiver having a phase slip estimation processing function for estimating the phase slip by the phase compensation unit by using the plurality of pilot sequences, and for estimating a phase difference component by the error correction decoding unit, to thereby correct a phase of the received data. Further, according to another embodiment of the present invention, there is provided a transmitter to be used under an environment in which a phase slip or a phase fluctuation occurs, for allowing a receiver to execute a phase slip estimation processing function for correcting a phase of received data, the transmitter being configured to: transmit a transmission signal subjected to modulation after error correction coding; and transmit a signal formed of a plurality of pilot sequences as a part of the transmission signal.

Further, according to another embodiment of the present invention, there is provided a communication method, which is employed for a communication device to be used under an environment in which a phase slip or a phase fluctuation occurs, the communication device including: a transmitter for transmitting a transmission signal subjected to modulation after error correction coding; and a receiver including: a phase compensation unit for receiving the transmission signal transmitted from the transmitter as a received signal, and performing demodulation therefor while maintaining synchronization thereof; and an error correction decoding unit for performing decoding processing for received data that has been subjected to the demodulation, the communication method including: transmitting, by the transmitter, a signal formed of a plurality of pilot sequences as a part of the transmission signal; and estimating, by the receiver, a phase difference component based on decision information output after decoding or during the decoding by using the plurality of pilot sequences and using hard-decision iterative decoding or soft-decision iterative decoding for an error correction code, and executing a phase slip estimation processing function for correcting a phase of the received data based on the estimated phase difference component.

Advantageous Effects of Invention

According to one embodiment of the present invention, decision iterative decoding is performed for the error correction code including a plurality of pilot symbols, the phase difference component is estimated by using the decision information output after the decoding or during the decoding, the phase of the received data is corrected by the estimated phase difference component, and iterative decoding is continued based on a value obtained after the correction. Accordingly, it is possible to obtain the receiver, the transmitter, and the communication method, which exhibit performance close to that of synchronous detection even when the phase slip occurs.

DESCRIPTION OF EMBODIMENTS

Now, a description is made of a receiver, a transmitter, and a communication method according to preferred embodiments of the present invention with reference to the accompanying drawings.

First Embodiment

This first embodiment is described by taking a case in which a low-density parity-check (LDPC) code is used as FEC as an example for the purpose of building a communication system that exhibits performance close to that of synchronous detection even when a phase slip occurs. Note that, in this first embodiment, the LDPC code is used as an example, but not only the LDPC code but also all error correction codes including a turbo code, a product code, a concatenated code, a Bose-Chaudhuri-Hocquenghem (BCH) code, a Reed-Solomon (RS) code, and a convolutional code are applicable in the same procedure.

Figure 1:
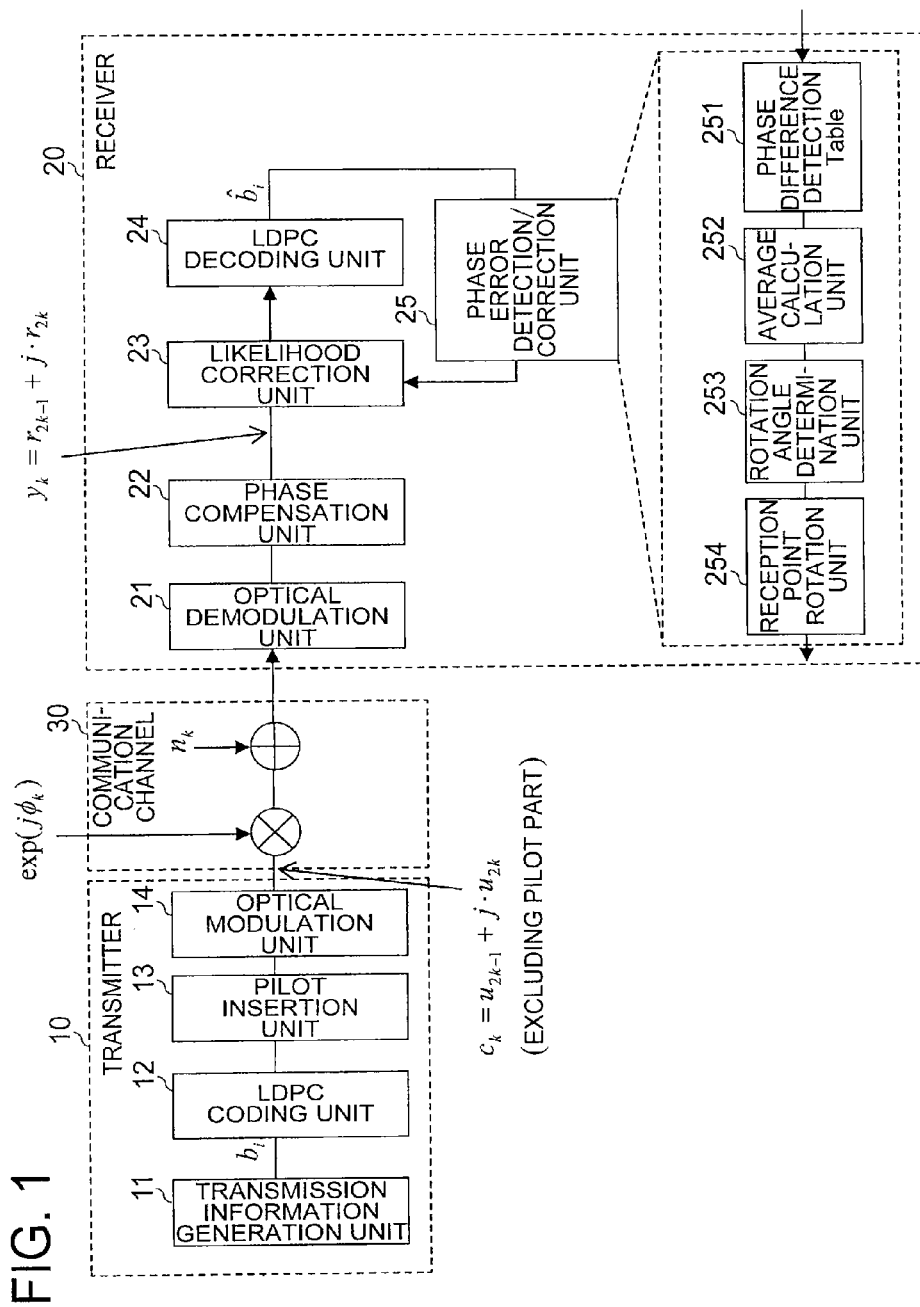
FIG. 1 is a configuration diagram of a communication system according to a first embodiment of the present invention.
Figure 14:
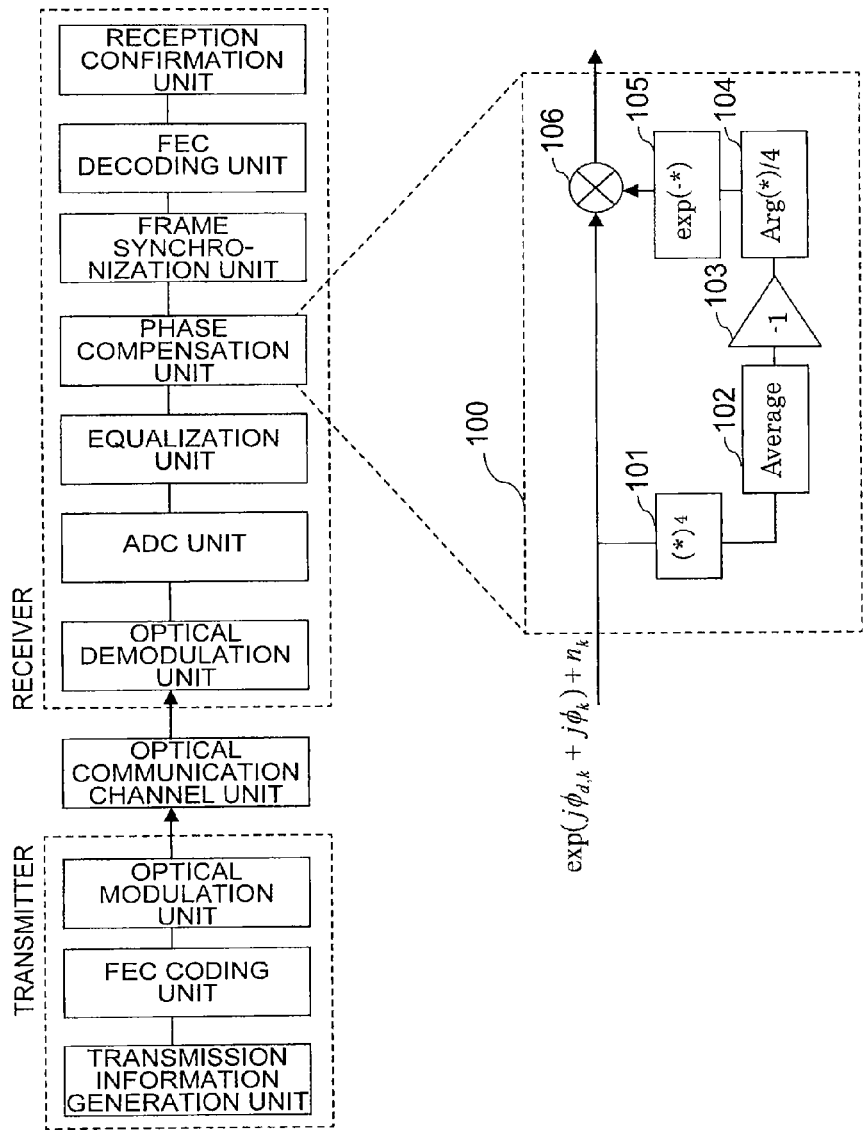
FIG. 14 is a circuit configuration diagram of a related-art optical communication system.

FIG. 1 is a configuration diagram of the communication system according to the first embodiment of the present invention. The communication system illustrated in FIG. 1 includes a transmitter 10, a receiver 20, and a communication channel 30 for connecting both to each other. Note that, FIG. 1 omits an ADC unit, an equalization unit, and a frame synchronization unit, which exist in FIG. 14, only because those units do not relate directly to the present invention, and there is no problem even when those units exist as in the related-art example.

Here, the transmitter 10 includes a transmission information generation unit 11, an LDPC coding unit 12, a pilot insertion unit 13, and an optical modulation unit 14. Further, the receiver 20 includes an optical demodulation unit 21, a phase compensation unit 22, a likelihood correction unit 23, an LDPC decoding unit 24, and a phase error detection/correction unit 25. In addition, the phase error detection/correction unit 25 within the receiver 20 includes a phase difference detection table 251, an average calculation unit 252, a rotation angle determination unit 253, and a reception point rotation unit 254.

Figure 2:
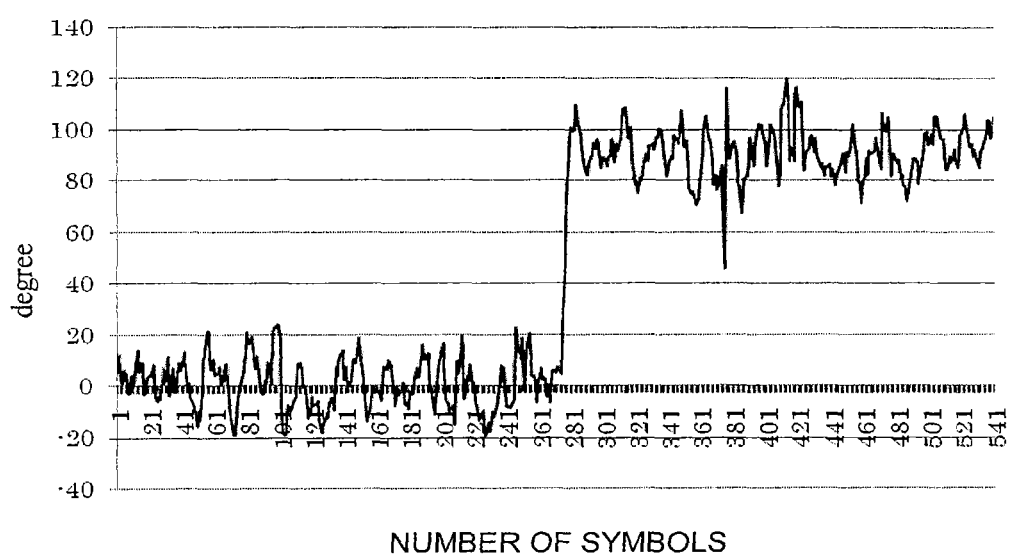
FIG. 2 is a graph showing how a phase slip appears when a pilot symbol is corrected after the phase compensation is performed by a related-art fourth-power method.

Further, FIG. 2 is a graph showing how the phase slip appears when a pilot symbol is corrected after the phase compensation is performed by a related-art fourth-power method. The horizontal axis represents the number of symbols, and the vertical axis represents a phase angle.

Figure 3:
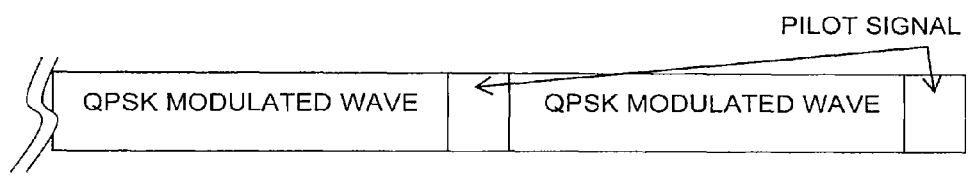
FIG. 3 is a diagram illustrating a frame structure used for the communication system according to the first embodiment of the present invention.

Further, FIG. 3 is a diagram illustrating a frame structure used for the communication system according to the first embodiment of the present invention. As illustrated in FIG. 3, it is assumed that known pilot symbols are inserted at fixed symbol intervals in the frame structure applied to this first embodiment.

Figure 4:
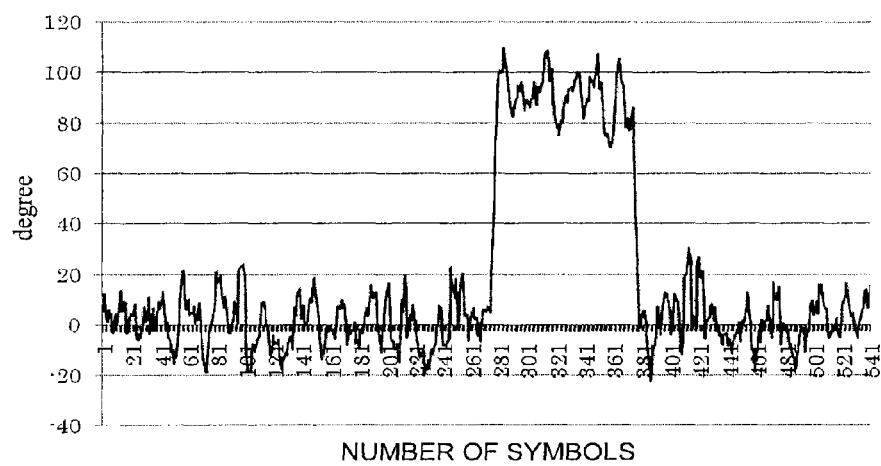
FIG. 4 is a graph showing a situation in which a phase error can be suppressed to a finite phase slip by the communication system according to the first embodiment of the present invention.

By applying the frame structure illustrated in FIG. 3 to such an occurrence of the phase slip as shown in FIG. 2 to detect the pilot symbols, it is possible to detect the phase slip and suppress a phase error to a finite phase slip. FIG. 4 is a graph showing a situation in which the phase error can be suppressed to the finite phase slip by the communication system according to the first embodiment of the present invention.

Next, a description is made of an operation of the communication system according to this first embodiment illustrated in FIG. 1.

A binary information sequence $b_i \in \{0,1\}$, where $i=1, 2, \ldots,$ and $K$, generated by the transmission information generation unit 11 is input to the LDPC coding unit 12. Here, $K$ represents a length of the information sequence.

The LDPC coding unit 12 generates a codeword sequence ($b_1, b_2, \ldots,$ and $b_K$ and $p_1, p_2, \ldots,$ and $p_{N-K}$). Here, $N$ represents a codeword length, and ($p_1, p_2, \ldots,$ and $p_{N-K}$) represents a parity sequence.

Next, the pilot insertion unit 13 inserts a pilot symbol to the codeword sequence generated by the LDPC coding unit 12 at fixed symbol intervals as illustrated in FIG. 3 described above. In addition, the optical modulation unit 14 is configured to map a codeword to a transmission signal $u_i$ by the following procedure.

[Math. 3]

$$\text{For } 1 \le i \le K \qquad (1)$$
$$u_i = \begin{cases} 1 & (b_i = 0) \\ -1 & (b_i = 1) \end{cases},$$
$$\text{for } K < i \le N$$
$$u_i = \begin{cases} 1 & (p_{i-K} = 0) \\ -1 & (p_{i-K} = 1) \end{cases}$$

Next, a codeword sequence $c_k$, where $k=1, 2, \ldots,$ and $N/2$, which is a complex representation obtained by QPSK-modulating the transmission signal $u_i$, is expressed as follows. Note that, this method produces an equivalent effect with other modulation methods than QPSK.

[Math. 4]

$$c_k = u_{2k-1} + j \cdot u_{2k} \qquad (2)$$

On the receiver 20 side, it is assumed that complex additive white Gaussian noise (AWGN) $n_k$ is received in the communication channel 30.

Here, $n_k$ is assumed as:

$$E[|n_k|^2] = 2\sigma_0^2.$$

Further, $\sigma_0^2$ represents a variance of Gaussian noise.

Further, assuming that a phase shift caused by phase noise due to a laser within the communication channel 30 or a nonlinear phase shift and phase estimation correction using the fourth-power method or the like is $\phi_k$, a received codeword sequence $y_k$, which is a complex representation obtained by performing QPSK-modulation, is obtained as follows.

[Math. 5]

$$y_k = \exp(j\phi_k) \cdot c_k + n_k = r_{2k-1} + j \cdot r_{2k} \qquad (3)$$

Figure 5:
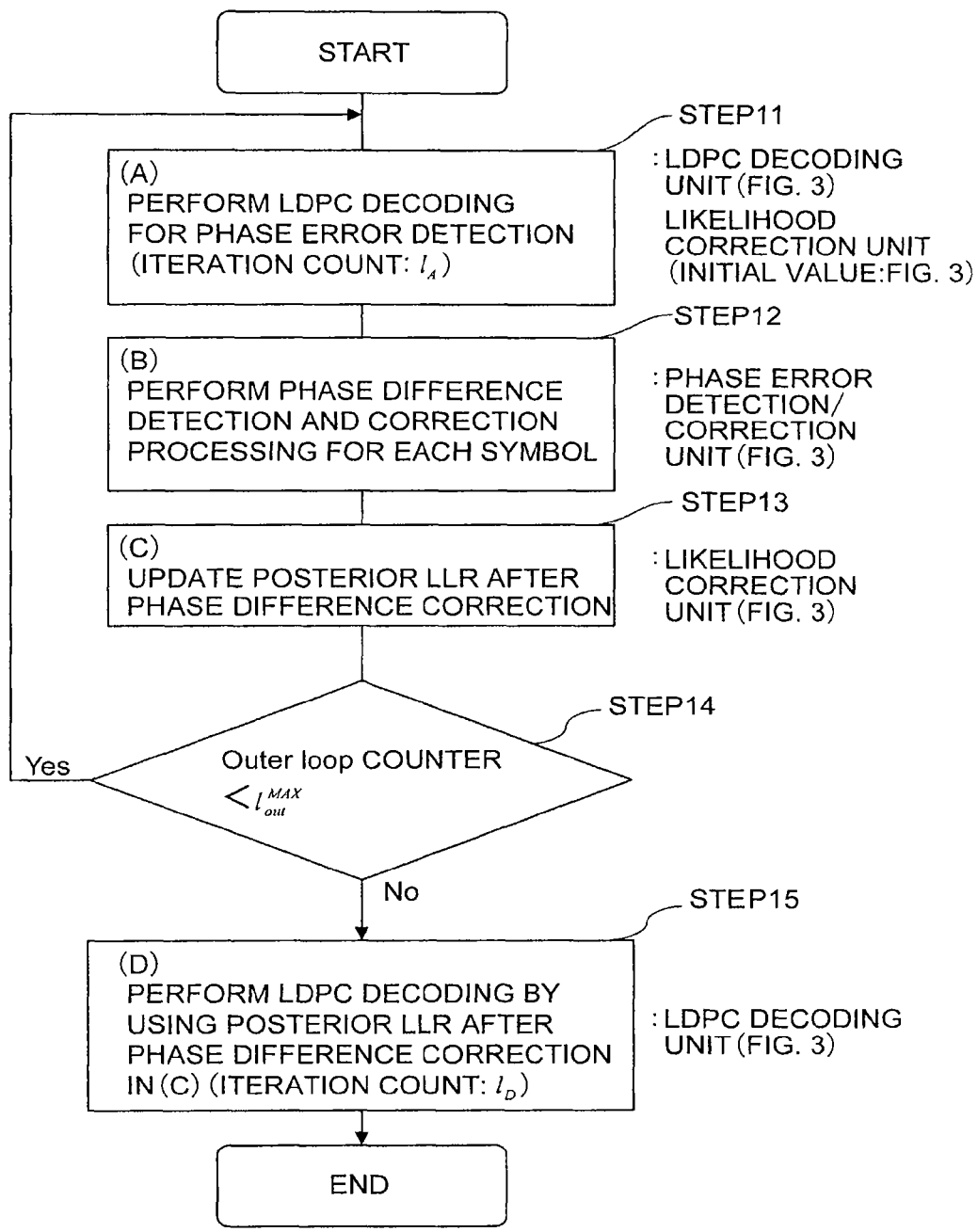
FIG. 5 is a flowchart illustrating a phase slip estimation/correction LDPC decoding method used by a receiver according to the first embodiment of the present invention.

Here, $r_{2k-1}$ and $r_{2k}$ are complex components of the received codeword sequence. On the assumption that the received codeword sequence $y_k$ indicated in the above-mentioned expression (3) is input, a decoding algorithm is described below with reference to a flowchart. FIG. 5 is a flowchart illustrating a phase slip estimation/correction LDPC decoding method used by the receiver 20 according to the first embodiment of the present invention. Note that, in FIG. 5, an LLR means a log likelihood ratio.

In this first embodiment, a method of estimating the phase error by using a hard-decision output bit from an LDPC decoding method is proposed for recovery from the deterioration in synchronization performance due to the phase shift caused by the phase noise due to the laser within the communication channel 30 or the nonlinear phase shift and the phase estimation correction using the fourth-power method or the like. However, in a phase error estimation method according to this first embodiment, an estimated value can be calculated even by using soft-decision information instead of hard-decision information.

In this first embodiment, an LDPC decoding algorithm that employs phase error detection/correction based on filtering using averaging is proposed. In this algorithm, a process including the following four steps A to D is executed in iterative decoding.

(A) STEP 11: LDPC decoding processing for phase error detection performed by the LDPC decoding unit 24

(B) STEP 12: Phase difference detection and correction processing for each symbol performed by the phase error detection/correction unit 25

(C) STEP 13 and STEP 14: Update processing for a posterior LLR after phase difference correction, which is performed by the likelihood correction unit 23

(D) STEP 15: LDPC decoding processing using the posterior LLR after phase error correction, which is performed by the LDPC decoding unit 24

Next, the respective steps are described in detail.

(A) Regarding STEP 11: the LDPC decoding processing for phase error detection performed by the LDPC decoding unit 24

(A-1): Initialization

Now, assuming that the processing of STEP 11 to STEP 13 illustrated in FIG. 5 has been finished and that a value of the outer loop counter determined in STEP 14 is $l_{out}$, the posterior log likelihood ratio (hereinafter referred to as "posterior LLR") to $u_i$ after the ($l_{out}$)th iterative decoding is set as the following expression.

$$L_u^{l_{out}}(u_i) \quad \text{[Math. 6]}$$

However, only the initial value indicated by the following expression is set to the log likelihood ratio obtained from an AWGN communication channel.

$$L_u^{l_{out}=0}(u_i) \quad \text{[Math. 7]}$$

Accordingly, this initial value is set as the following expression (4). Note that, the AWGN communication channel is merely an example, and a communication channel other than that can be used to obtain the initial value. Note that, the initial value is acquired from the likelihood correction unit 23. Further, the initial value is not subjected to correction.

[Math. 8]

$$L_u^0(u_i) := \ln \frac{Pr\{u_i = +1 \mid r\}}{Pr\{u_i = -1 \mid r\}} = \frac{1/\sqrt{2\pi\sigma_0^2} \exp(-(r_1 - 1)^2/2\sigma_0^2)}{1/\sqrt{2\pi\sigma_0^2} \exp(-(r_1 + 1)^2/2\sigma_0^2)} = \frac{2r_i}{\sigma_0^2} \quad (4)$$

Here, $\sigma_0^2$ in the above-mentioned expression (4) is set as a variance of AWGN noise, and r is a block of the received symbols and set as $r=(r_1, r_2, \ldots, r_N)$. Further, an initial variable of the outer loop counter is set as $l_{out}=0$, and a variable of a maximum iteration count is set to:

$$l_{out}^{max}. \quad \text{[Math. 9]}$$

(A-2): LDPC Decoding

The LDPC decoding unit 24 executes LDPC decoding with:

$$L_u^{l_{out}}(u_i) \quad \text{[Math. 10]}$$

used as an input value (whose internal iterations are executed $l_A$ times).

(B) Regarding STEP 12: the phase difference detection and correction processing for each symbol performed by the phase error detection/correction unit 25

(B-1): Hard-Decision Bit Output

In the LDPC decoding in (A-2) described above, the LDPC decoding unit 24 outputs a temporary estimated signal:

$$\hat{u}_i, i=1,2,\ldots,N \quad \text{[Math. 11]}$$

after $l_A$ iterations.

(B-2): Derivation of a Phase Difference Between a Received Signal and the Temporary Estimated Signal The phase error detection/correction unit 25 derives a phase difference $\Delta\theta_k$ between the received signal and the temporary estimated signal from this temporary estimated signal by the following processing.

$$\Delta\theta_k = \theta_k - \tan^{-1}\frac{\hat{u}_{2k}}{\hat{u}_{2k-1}}, k = 1, 2, \ldots, N/2 \quad \text{[Math. 12]}$$

where $$\theta_k = \tan^{-1}\frac{r_{2k}}{r_{2k-1}}$$

Note that, in terms of implementation, the calculation of $\tan^{-1}$ or the like can be implemented simply by referring to a table or the like. For example, it suffices to refer to the phase difference detection table 251 or the like illustrated in FIG. 1.

(B-3): Averaging of Phase Difference Components

The phase error detection/correction unit 25 averages the phase difference components of S consecutive symbols by the following expression.

$$\Delta\theta_k^A = \frac{1}{S}\sum_{i=k-S}^{k}\Delta\theta_i \quad \text{[Math. 13]}$$

For example, S=8 to 16 or the like produces an effect, but such a value of S is adjusted depending on a communication situation. This averaging processing corresponds to the processing performed by the average calculation unit 252 illustrated in FIG. 1. Note that, when S is, for example, an integer expressed as an exponential of base 2 such as 8 or 16, the implementation is made possible by S adders and shift registers, which produces an effect of reduction of circuits.

(B-4): Phase Slip Determination

In addition, by using $\Delta\theta_k^A$ obtained in (B-3) with respect to a received signal $y_k=\exp(j\phi_k)\cdot c_k+n_k$, the phase error detection/correction unit 25 performs phase slip determination and phase error correction by the following procedure, to thereby obtain a corrected received signal:

$$\hat{y}_k. \quad \text{[Math. 14]}$$

$$\hat{y}_k = \begin{cases} y_k \cdot \exp(-j \cdot \text{sgn}(\Delta\theta_k^A) \cdot \pi/2), & \text{if } 3\pi/4 > |\Delta\theta_k^A| \geq \pi/4 \\ y_k \cdot \exp(-j \cdot \pi), & \text{if } |\Delta\theta_k^A| \geq 3\pi/4 \end{cases} \quad \text{[Math. 15]}$$

As a result $$\hat{r}_{2k-1} = \begin{cases} \sqrt{2} \cdot \cos(\theta_k - \text{sgn}(\Delta\theta_k^A) \cdot \pi/2), & \text{if } 3\pi/4 > |\Delta\theta_k^A| \geq \pi/4 \\ \sqrt{2} \cdot \cos(\theta_k - \text{sgn}(\Delta\theta_k^A) \cdot \pi), & \text{if } |\Delta\theta_k^A| \geq 3\pi/4 \end{cases}$$

$$\hat{r}_{2k} = \begin{cases} \sqrt{2} \cdot \sin(\theta_k - \text{sgn}(\Delta\theta_k^A) \cdot \pi/2), & \text{if } 3\pi/4 > |\Delta\theta_k^A| \geq \pi/4 \\ \sqrt{2} \cdot \sin(\theta_k - \text{sgn}(\Delta\theta_k^A) \cdot \pi), & \text{if } |\Delta\theta_k^A| \geq 3\pi/4 \end{cases}$$

Note that, $\pi/4=45°$ and $3\pi/4=135°$, which are used as threshold values for correction of $\pm\pi/2=\pm90°$ and $\pi=180°$ in the above-mentioned corrected received signal, are adjustable values, and can assume other values than those. Such processing for obtaining the corrected received signal corresponds to processing performed by the rotation angle determination unit 253 and the reception point rotation unit 254 illustrated in FIG. 1. Note that, comparison with the threshold value is performed by a comparator, and 90° and 180° rotations can be performed only by selecting an in-phase component and an orthogonal component and selecting a sign, which allows simple implementation.

Figure 6:
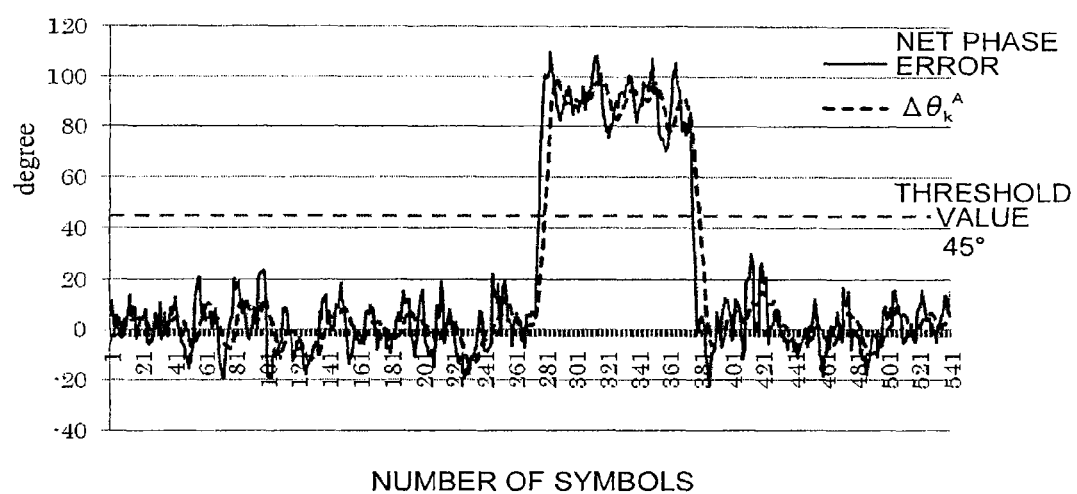
FIG. 6 is a graph showing a relationship between a "net phase error", which is obtained by subtracting a phase of a transmission signal from a phase of a received signal $y_k$, and $\Delta\theta_k^A$, which is obtained by subtracting a phase estimated from a temporary estimated signal after LDPC decoding from the phase of the received signal $y_k$ and averaging the resultant, according to the first embodiment of the present invention.

FIG. 6 is a graph showing a relationship between a "net phase error", which is obtained by subtracting a phase of a transmission signal from a phase of the received signal $y_k$, and $\Delta\theta_k^A$, which is obtained by subtracting a phase estimated from the temporary estimated signal after the LDPC decoding from the phase of the received signal $y_k$ and averaging the resultant, according to the first embodiment of the present invention. Note that, a net phase difference component shown in FIG. 6 indicates a situation in which a phase slip has occurred with a period therefor spanning 100 symbols.

(C) Regarding STEP 13 and STEP 14: the update processing for the posterior LLR after the phase difference correction, which is performed by the likelihood correction unit 23

The likelihood correction unit 23 sets the variable of the outer loop counter as:

$$l_{OUT}=l_{OUT}+1.$$

The posterior LLR:

$$L_u^{lout}(u_i) \quad \text{[Math. 16]}$$

for the ($l_{out}$)th time indicated by the outer loop counter, which is updated by temporarily correcting the phase error by a hard-decision bit, is given by the following expression.

[Math. 17]

$$L_u^{lout}(u_i) := \ln\frac{Pr\{u_i=+1|\hat{r}\}}{Pr\{u_i=-1|\hat{r}\}} = \frac{2\hat{r}_i}{\sigma_0^2}$$

Here, $$\hat{r} \quad \text{[Math. 18]}$$

is a block of estimated received symbols, and is set as follows.

$$\hat{r}:=(\hat{r}_1,\hat{r}_2,\ldots,\hat{r}_N) \quad \text{[Math. 19]}$$

The likelihood correction unit 23 returns the processing to (A-1) when determining in STEP 14 that $l_{OUT} < l_{OUT}^{max}$. On the other hand, the likelihood correction unit 23 advances to the processing of (D) STEP 15 as the subsequent step when determining that $l_{OUT}=l_{OUT}^{max}$.

(D) Regarding STEP 15: the LDPC decoding using the posterior LLR after the phase error correction, which is performed by the LDPC decoding unit 24

(D-1): LDPC Decoding

The LDPC decoding unit 24 executes the LDPC decoding with:

$$L_u^{loutMAX}(u_i) \quad \text{[Math. 20]}$$

used as an input value (whose internal iterations are executed $l_D$ times).

(D-2): Parity Check

When an estimated word:

$$(\hat{b}_1,\hat{b}_2,\ldots,\hat{b}_K,\hat{p}_1,\hat{p}_2,\ldots,\hat{p}_{N-K}) \quad \text{[Math. 21]}$$

output by the LDPC decoding in (D-1) satisfies the following expression (5):

[Math. 22]

$$H \cdot (\hat{b}_1,\hat{b}_2,\ldots,\hat{b}_K,\hat{p}_1,\hat{p}_2,\ldots,\hat{p}_{N-K})^T = 0 \quad (5)$$

the LDPC decoding unit 24 determines that all errors have been corrected, while determining that an error remains when the condition is not satisfied.

This information may be used as reference information. Further, H in the above-mentioned expression (5) represents a check matrix of the LDPC code, and $(\ )^T$ represents a transpose.

Note that, in the above-mentioned first embodiment, in the LDPC decoding performed in each of STEP 11 of (A) and STEP 15 of (D), an iteration count is fixed to $l_A$ and $l_D$, respectively. However, a temporary estimated word output in the middle of iterations may be used to observe whether or not all errors have been corrected in the calculation of the above-mentioned expression (5), and the calculation may be finished when the above-mentioned expression (5) is satisfied. In that case, there is an effect of reducing a calculation amount.

By the above-mentioned operations, phase error estimation can be performed with high accuracy by the iterative decoding. Therefore, the synchronous detection can be applied even with the communication channel to which a differential modulation has been inevitably applied, and gains of approximately 3 dB at maximum and approximately 1.4 dB at maximum can be obtained for differential detection and differential synchronous detection, respectively.

Figure 7:
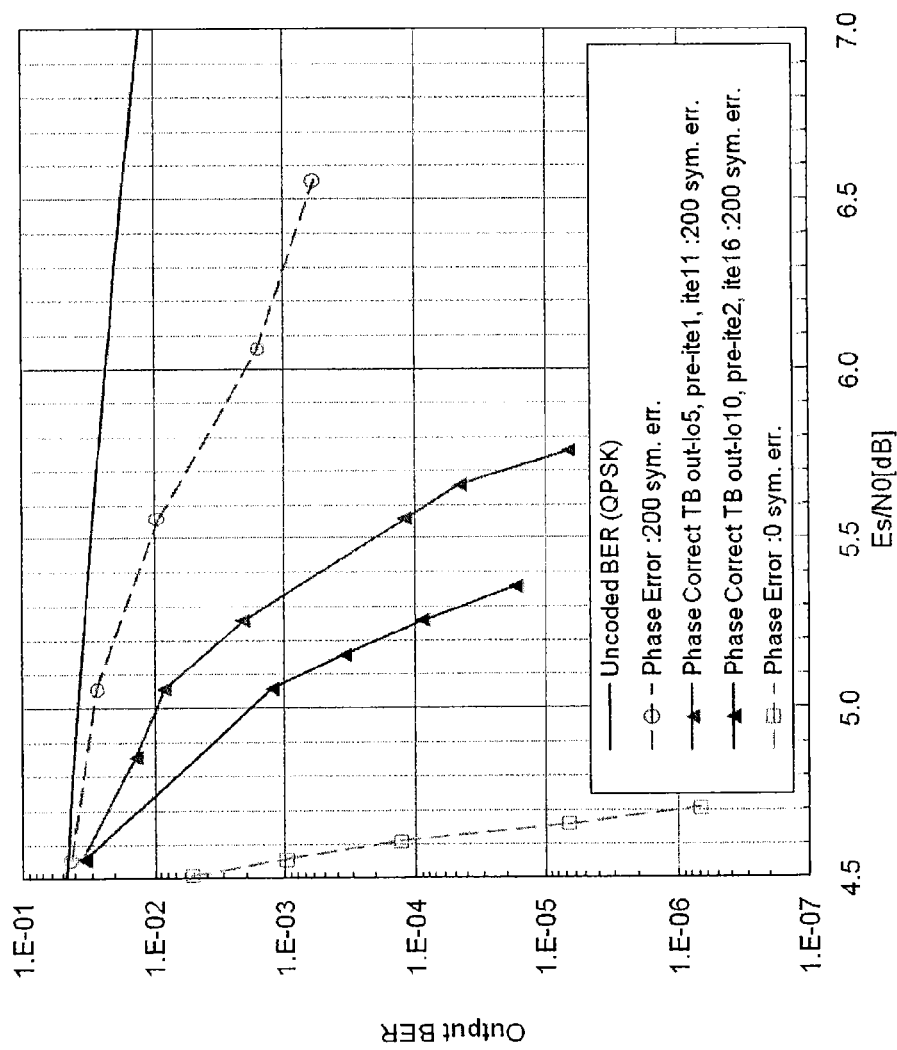
FIG. 7 is a graph showing evaluation results from an actual computer simulation regarding a communication device according to the first embodiment of the present invention.

FIG. 7 is a graph showing evaluation results from an actual computer simulation regarding a communication device according to the first embodiment of the present invention. As simulation conditions therefor, in an SNR (Es/N0 is specified as the horizontal axis in FIG. 7) under an AWGN noise environment, a phase slip is caused to occur once within one codeword, and consecutive symbol errors are set as 200 symbols. QPSK is used for modulation.

FIG. 7 shows the following five kinds of result in order from top to bottom.

(1) "Uncoded BER (QPSK)" indicated by the solid line represents performance at a time of uncoding.

(2) "Phase Error: 200 sym. err." indicated by ○ and the dotted line is obtained by performing normal LDPC decoding processing without particularly performing the phase correction when the phase slip of 200 symbol errors has occurred.

(3) "Phase Error: 0 sym. err." indicated by □ and the dotted line is obtained by performing the normal LDPC decoding processing when the phase slip has not occurred.

(4) "Phase Correct TB out-lo5, pre-ite1, ite11: 200 sym. err." indicated by the filled triangles and the solid line and shown below the line of (2) represents performance to which the method according to this first embodiment is applied, and "out-lo5" means that the maximum outer loop counter $1_{OUT}^{max}$ is 5 with "pre-ite1" indicating $1_A=1$ and "ite11" indicating $1_D=11$.

(5) "Phase Correct TB out-lo10, pre-ite2, ite10: 200 sym. err." indicated by the filled triangles and the solid line and shown below the line of (4) represents performance to which the method according to this first embodiment is applied, and "out-lo10" means that the maximum outer loop counter $1_{OUT}^{max}$ is 10 with "pre-ite2" indicating $1_A=2$ and "ite16" indicating $1_D=16$.

As understood also from FIG. 7, the performance is further improved as the numbers of iterations of $1_{OUT}^{max}$, $1_A$, and $1_D$ are increased, and tends to be closer to the line of (3) representing the performance obtained when the phase slip has not occurred.

Note that, in the configuration described with reference to FIG. 5 including (A) STEP 11, (B) STEP 12, and (C) STEP 13 executed in order, the LDPC decoding is iterated $1_A$ times in (A) STEP 11, and the obtained hard-decision bit is used to perform the processing of (B) STEP 12 and (C) STEP 13.

Accordingly, in the case of such a configuration, after having been executed, each of STEP 11 to STEP 13 needs to wait until the other steps are finished. For example, in a case where this configuration is implemented as a circuit, once the processing of (A) STEP 11 is finished, the processing of a circuit block having a function of (A) STEP 11 is kept from being performed until (B) STEP 12 and (C) STEP 13 are finished.

However, such a configuration is merely an example, and (A) STEP 11, (B) STEP 12, (C) STEP 13 may be executed in parallel for part of data. For example, in this configuration, instead of outputting hard-decision bits of all LDPC codewords after the decoding, whose internal iterations are executed $1_A$ times, is executed in (A) STEP 11, the hard-decision bits corresponding to a part of the LDPC codewords are output to (B) STEP 12 after each iteration is finished.

At the subsequent time, (B) STEP 12 and (C) STEP 13 are executed for output hard-decision bit data, while the LDPC decoding is performed in (A) STEP 11 at the same time, to thereby output the hard-decision bit of a part different from the previous output to (B) STEP 12. In addition, at the subsequent time, the posterior LLR obtained after the phase difference correction, a part of which was updated in (C) STEP 13, is used to perform the LDPC decoding in (A) STEP 11, while the processing of (B) STEP 12 and (C) STEP 13 is performed by using the hard-decision bit output at the previous time.

By providing such a configuration, it is possible to execute (A) STEP 11, (B) STEP 12, and (C) STEP 13 with more efficiency than in the configuration in which the subsequent steps are executed in order as soon as the previous step is finished, which can improve a throughput of the circuit to which the present invention is implemented.

As described above, according to the first embodiment, by use of decision iterative decoding for the error correction code, the phase difference component is estimated by using decision information output after the decoding or during the decoding, the phase error is corrected for an input decision value of a decoding circuit based on the estimated value, and the iterative decoding is continued based on the value obtained after the correction. With this configuration, the phase error is further corrected as the number of times of the iterative decoding increases, which reduces an error probability of a final decoding result to a lower level.

As a result, it is possible to perform the decoding with an influence of the phase error removed to a large extent, and even with the communication channel exhibiting a significant phase fluctuation, it is possible to obtain the decoding performance close to that of the synchronous detection. More specifically, the synchronous detection can be applied even with the communication channel to which the differential modulation has been inevitably applied, and the gains of approximately 3 dB at maximum and approximately 1.4 dB at maximum can be obtained for the differential detection and the differential synchronous detection, respectively.

Second Embodiment

In this second embodiment, a description is made of a specific example in which high-accuracy phase slip detection is performed in consideration of a slip probability caused in the phase compensation unit 22 illustrated in FIG. 1 described above. A probability that the phase slip occurs in the phase compensation unit 22 depends on the SNR, the nonlinear phase shift, and phase noise/wavelength offset of a light source. In this second embodiment, a developmental process of a phase slip is described by a Markov model.

In a 4-state Markov model, which is most simple, a phase $\phi_k$ obtained after the phase compensation in the k-th symbol depends only on the phase $\phi_{k-1}$ of the previous symbol. Here, the phase $\phi_k$ is $s_k \pi/2$, and $s_k$ assumes one of the values 0, 1, 2, and 3 indicating the four states. Assuming that a transition probability from a state $s_{k-1}$ to a state $s_k$ is expressed as:

$$Pr(s_k|s_{k-1}) = q_{s_k,s_{k-1}} \quad \text{[Math. 23]}$$

a Markov state transition probability matrix Q is expressed as follows.

[Math. 24]

$$Q = \begin{bmatrix} q_{0,0} & q_{1,0} & q_{2,0} & q_{3,0} \\ q_{0,1} & q_{1,1} & q_{2,1} & q_{3,1} \\ q_{0,2} & q_{1,2} & q_{2,2} & q_{3,2} \\ q_{0,3} & q_{1,3} & q_{2,3} & q_{3,3} \end{bmatrix}$$

A transition probability matrix of the above-mentioned expression can be generally expressed as such a circulant matrix as follows.

[Math. 25]

$$Q = \sum_{m=0}^{3} q_{m,0} \begin{bmatrix} 0 & 1 & 0 & 0 \\ 0 & 0 & 1 & 0 \\ 0 & 0 & 0 & 1 \\ 1 & 0 & 0 & 0 \end{bmatrix}^m$$

By use of the transition probability matrix, a conditional probability between phase states spaced apart by a plurality of symbols is also obtained as an exponential of base Q with ease. Note that, the above-mentioned circulant matrix can be diagonalized by the following Fourier orthogonal basis, and hence an exponential of the transition probability matrix can be calculated with ease.

[Math. 26]

$$Q = \sum_{m=0}^{3} q_{m,0} \begin{bmatrix} 0 & 1 & 0 & 0 \\ 0 & 0 & 1 & 0 \\ 0 & 0 & 0 & 1 \\ 1 & 0 & 0 & 0 \end{bmatrix}^m$$

Further, in order to model a behavior of the phase compensation unit 22 with more accuracy, it is possible to use a high-order Markov model using the conditional probability spanning a plurality of symbols. By initially setting an appropriate state transition probability:

$$q_{\mu_k,\mu_{k-1}}$$ [Math. 27]

corresponding to an actual communication system configuration to a register, this method is operated.

In a method proposed in this second embodiment, a process including the following steps is executed.

(A) STEP 21: Phase detection processing for a pilot signal performed by the phase compensation unit 22

(B) STEP 22: Likelihood rotation/correction processing corresponding to phase detection, which is performed by the likelihood correction unit 23

(C) STEP 23: Error correction decoding processing performed by the LDPC decoding unit 24

(D) STEP 24: Phase detection update processing using a hard-decision value performed by the phase error detection/correction unit 25

Next, the respective steps are described in detail.

(A) Regarding STEP 21: the phase detection processing for the pilot signal performed by the phase compensation unit 22

It is assumed that a known sequence signal having a short symbol length is periodically inserted by the pilot insertion unit 13 in the transmitter 10 illustrated in FIG. 1 described above as in FIG. 3 described above. Here, for the sake of brevity, the description is made by assuming a pilot sequence having a single QPSK-modulated symbol length.

A known pilot complex transmission symbol in the m-th cycle is set as $c'_m$, and the received symbol is set as $y'm$. Further, assuming that an insertion interval for a pilot is represented by K, an increase in redundancy due to pilot insertion is $1/(K-1)$, and a transmission signal sequence is as follows.

$$\{ \ldots, c'_m, c_{m(K-1)+1}, c_{m(K-1)+2}, \ldots, c_{(m+1)(K-1)}, c'_{m+1}, c_{(m+1)(K-1)+1}, \ldots \}$$ [Math. 28]

In STEP 21, on the receiver 20 side, a transmission data sequence is unknown at first, and hence only a known pilot signal is used to perform the detection of the phase slip at every interval of K symbols. The received signal of the m-th pilot signal is passed through a blind phase compensation unit, and then expressed as in the following expression (6) in the same manner as the above-mentioned expression (3).

[Math. 29]

$$y'_m = \exp\left(j\frac{\pi}{2}s'_m\right) \cdot c'_m + n'_m \quad (6)$$

The simplest method of estimating a phase slip state $s_k$ is a single pilot maximum-likelihood estimation solution of the following expression (7).

[Math. 30]

$$\hat{s}_m = \underset{s'_m}{\operatorname{argmin}} \left| y'_m - \exp\left(j\frac{\pi}{2}s'_m\right) \cdot c'_m \right|^2 \quad (7)$$

$$= \begin{cases} 0 & (\operatorname{Re}[y'^*_m c'_m] > \operatorname{Im}[y'^*_m c'_m] \ \&\operatorname{Re}[y'^*_m c'_m] > -\operatorname{Im}[y'^*_m c'_m]) \\ 1 & (\operatorname{Re}[y'^*_m c'_m] > \operatorname{Im}[y'^*_m c'_m] \ \&\operatorname{Re}[y'^*_m c'_m] < -\operatorname{Im}[y'^*_m c'_m]) \\ 2 & (\operatorname{Re}[y'^*_m c'_m] < \operatorname{Im}[y'^*_m c'_m] \ \&\operatorname{Re}[y'^*_m c'_m] < -\operatorname{Im}[y'^*_m c'_m]) \\ 3 & (\operatorname{Re}[y'^*_m c'_m] < \operatorname{Im}[y'^*_m c'_m] \ \&\operatorname{Re}[y'^*_m c'_m] > -\operatorname{Im}[y'^*_m c'_m]) \end{cases}$$

Here, x*, Re[x], and Im[x] represent a conjugate, a real part, and an imaginary part of a complex argument, respectively. When the phase slip is detected only by a single pilot sequence as described above, an influence of noise $n'_m$, is exerted to a large extent, and hence an estimation error of the phase slip frequently occurs. Although a pilot sequence length needs to be set long in order to reduce an influence of the noise, the insertion of a long pilot sequence causes an increase in redundancy. Therefore, in this second embodiment, the phase detection using a plurality of pilot sequences is performed based on a Markov transition probability of the phase slip.

As described above, the transition probability between the phase states spaced apart by K symbols serving as a pilot insertion interval can be described as $Q^K$ by using the Markov model. As a pilot interval becomes larger, the probability of transition to another phase state becomes higher, to become asymptotic toward a steady-state equal probability state exponentially. A pilot sequence count in close proximity which is effective for the phase estimation can be determined by a symbol interval before becoming asymptotic toward a steady probability state. In the following, there are proposed three kinds of high-accuracy phase slip detection method corresponding to a magnitude of an amount of arithmetic operation that can be implemented.

(A-1) High-Accuracy Phase Slip Detection Method Using Majority Decision Determination Corresponding to an In-Phase Interval By using the Markov model, a maximum symbol length for keeping in-phase with high probability is calculated in advance. In other words, a maximum pilot sequence count M with which a diagonal component of $Q^{KM}$ exceeds a given threshold value (for example, 0.9) is obtained in advance. First, maximum-likelihood estimation of the above-mentioned expression (7) is temporarily performed for all pilot sequence simplexes.

Then, a final phase estimated value in the m-th cycle pilot symbol position is determined by majority decision for temporary estimated values of M pilot symbols before and after that. In this method, the pilot sequence count M for the majority decision can be set in advance, and majority decision processing having a small amount of arithmetic operation can be used, which can greatly reduce a slip detection error even with a similar amount of arithmetic operation to that of the maximum-likelihood estimation.

(A-2) High-Accuracy Phase Slip Detection Method Using Linear Filter Phase Estimation Based on a Minimum Mean Squared Error In the same manner as the method (A-1), consideration is made to perform the phase estimation in the m-th cycle pilot symbol position by using the M pilot symbols before and after that. However, unlike the method (A-1), there is no limitation to the setting of M (here referred to as "sliding window size"), and the noise can be reduced to a much lower level by using a sufficiently large value.

Here, assuming that the received signal of the M pilot symbols before and after is expressed as a vector:

$$y'_m = [y'_{m-M}, \ldots, y'_m, \ldots, y'_{m+M}]^T \quad \text{[Math. 31]}$$

having a size of 2M+1, the above-mentioned expression (6) can be rewritten as the following expression (8).

[Math. 32]

$$y'_m = \exp\left[j\frac{\pi}{2}s'_m\right] \circ c'_m + n'_m \quad (8)$$

Here, exp[X] represents an exponential function for each matrix element, and $$X \circ Y \quad \text{[Math. 33]}$$

represents a product (Hadamard product) of each matrix element. Further, the vectors μ'$_m$, c'$_m$, and n'$_m$ are respectively defined as the following expressions.

$$s'_m = [s'_{m-M}, \ldots, s'_m, \ldots, s'_{m+M}]^T$$

$$c'_m = [c'_{m-M}, \ldots, c'_m, \ldots, c'_{m+M}]^T$$

$$n'_m = [n'_{m-M}, \ldots, n'_m, \ldots, n'_{m+M}]^T \quad \text{[Math. 34]}$$

The phase estimation at a center m of a sliding window is performed by the following expression.

[Math. 35]

$$\hat{s}'_m = \arg\min_{s'_m} \text{Re}\left[\exp\left(j\frac{\pi}{2}s'_m\right) w_m^H y'_m\right]$$

Here, $X^H$ represents a Hermitian transpose of a matrix, and a weight of a linear filter can be expressed as the following expression (9) by a minimum mean squared error norm.

[Math. 36]

$$w_m R_m^{-1} b_m \quad (9)$$

A matrix $R_m$ and a vector $b_m$ are an autocorrelation matrix of the received signal and a cross-correlation vector with respect to the phase, respectively, and can be described by the following expressions.

[Math. 37]

$$R_m = E[y_m y_m^H]$$

$$= \text{diag}[c'_m] E\left[\exp\left[j\frac{\pi}{2}s'_m\right] \exp\left[j\frac{\pi}{2}s'_m\right]^H\right] \text{diag}[c'_m]^H + 2\sigma_0^2 I_{2M+1}$$

$$b_m = E\left[y_m \exp\left(-j\frac{\pi}{2}s'_m\right)\right]$$

$$= \text{diag}[c'_m] E\left[\exp\left[j\frac{\pi}{2}(s'_m - s'_m 1_{2M+1})\right]\right]$$

Here, diag[x] represents a diagonal square matrix obtained by arranging vector arguments as diagonal elements, $I_N$ represents a unit matrix having a size of N, and $1_N$ represents a vector formed of an entire element 1 having a size of N. In this second embodiment, by use of the Markov model, averaging processing E[X] regarding the above-mentioned autocorrelation/cross-correlation is analytically obtained in advance. Specifically, the following expression (10) is obtained.

[Math. 38]

$$E\left[\exp\left(j\frac{\pi}{2}(s'_{m+n} - s'_m)\right)\right] = \frac{1}{4}\sum_{s'_{m+n}, s'_m} q^{[Kn]}_{s'_{m+n}, s'_m} \exp\left(j\frac{\pi}{2}(s'_{m+n} - s'_m)\right) \quad (10)$$

Here, $q^{[Kl]}_{m,n}$ represents an element at an m-th row and an n-th column of $Q^{Kl}$ obtained as the Kl-th power of a Markov transition probability matrix. Because of being generally a circulant matrix, the above-mentioned expression (10) can be written as follows.

$$q_{0,0}^{[Kn]} - q_{2,0}^{[Kn]} + j \cdot (q_{1,0}^{[Kn]} - q_{3,0}^{[Kn]}) \quad \text{[Math. 39]}$$

In addition, normally, the direction of the phase slip is symmetrical, and hence $$q_{1,0}^{[Kn]} = q_{3,0}^{[Kn]} \quad \text{[Math. 40]}$$

is satisfied with a correlation value being only the real part.

A correlation of the phase state can be calculated in advance as described above, and a weight expression (9) for the linear filter can be decomposed into a time-invariant correlation weight vector W and a pilot symbol sequence c'$_m$ as follows.

$$W_m = \text{diag}[c'_m] W$$

This method of (A-2) requires the linear filter, and hence the amount of arithmetic operation is larger than the method (A-1) described above, but influences of the noise and the phase slip based on the Markov model are taken into consideration simultaneously, which greatly improves phase detection performance.

(A-3) High-Accuracy Phase Slip Detection Method Using Maximum Likelihood Sequence Estimation Here, a description is made of a sequence estimation method optimal for estimating the phase slip in accordance with the Markov model although the amount of arithmetic operation is the largest. Assuming that the number of all the pilot sequences for performing the phase estimation is set as 2M+1 for the purpose of convenience, a received signal sequence is described in the same manner as the above-mentioned expression (8). The method (A-2) described above principally aims at estimating a center phase of the sequence, but here, a phase transition of an entire sequence is estimated.

At this time, the conditional probability of receiving a sequence y'$_m$ when a phase slip state sequence s'$_m$ is given is referred to as "likelihood", and is represented as the following expression by taking into consideration that the phase slip depends only on the previous phase state.

[Math. 41]

$$Pr(y'_m | s'_m) = \frac{1}{4}\prod_4 Pr(y'_k | s'_k) Pr(s'_k | s'_{k-1})$$

In other words, a log likelihood is a sum of a log likelihood of a received symbol simplex and a logarithm of a phase transition probability over the entire sequence. Under the Gaussian noise, by using an element $q^{[K]}_{m,n}$ of $Q^K$ obtained as the K-th power of the Markov transition probability matrix, the log likelihood can be written as the following expression (11).

[Math. 42]

$$\ln Pr(y'_m \mid s'_m) = -\ln 4 + \sum_k \{\ln Pr(y'_k \mid s'_k) + \ln Pr(s'_k \mid s'_{k-1})\}$$

$$= -\ln 4 + \sum_k \left\{ -\ln(2\pi\sigma_0^2) - \frac{1}{2\sigma_0^2} \left| y'_k - \exp\left(j\frac{\pi}{2} s'_k\right) \cdot c'_k \right|^2 + \ln q_{s'_k, s'_{k-1}}^{[K]} \right\}$$

(11)

As in the above-mentioned expression (11), a maximum likelihood sequence is a path with which a sum of respective logarithmic elements is minimum, and maximum likelihood sequence estimation can be performed by using a Dijkstra's algorithm or the like efficient as a shortest route search algorithm. Note that, in the 4-state Markov model, it is possible to write it down as a 4-state trellis diagram, and hence a shortest route search can be made with a fixed memory length by using a Viterbi algorithm.

(B) Regarding STEP 22: the likelihood rotation/correction processing corresponding to the phase detection, which is performed by the likelihood correction unit 23

In STEP 22, the likelihood of an information symbol interval is corrected by the likelihood correction unit 23 in accordance with the phase state in a pilot position estimated in STEP 21. In QPSK modulation, when phase synchronization is perfectly maintained, as in the above-mentioned expression (4), the log likelihood ratio can be calculated by multiplying the complex component of the received signal by $2/\sigma_0^2$.

When the phase state estimated in STEP 21 is:

$$\hat{s}'_m$$ [Math. 43]

in the m-th pilot, the log likelihood of K/2 symbols before and after that is rotated as in the following expression.

[Math. 44]

$$\{L_u^0(u_{2k-1}), L_u^0(u_{2k})\} = \begin{cases} \{L_u^0(u_{2k-1}), L_u^0(u_{2k})\} & (\hat{s}'_m = 0) \\ \{L_u^0(u_{2k}), -L_u^0(u_{2k-1})\} & (\hat{s}'_m = 1) \\ \{-L_u^0(u_{2k-1}), -L_u^0(u_{2k})\} & (\hat{s}'_m = 2) \\ \{-L_u^0(u_{2k}), L_u^0(u_{2k-1})\} & (\hat{s}'_m = 3) \end{cases}$$

In other words, inversion of the sign of the LLR or substitution of the real part and the imaginary part is performed in accordance with the phase state. Therefore, a special arithmetic operation is not required.

The phase estimation is performed only in the pilot position for the first time, and hence it is not possible to determine in which symbol within the information symbol interval the phase transition has actually occurred. Therefore, there is proposed a method of improving characteristics by correcting the LLR with the rotated likelihood weighted. In the following, three different kinds of weighting method are described.

(B-1) Index Weight Correction

In the Markov model, in consideration that a probability of achieving an in-phase state decreases approximately exponentially relative to the symbol length, weighting is required to lower an information likelihood in a position distant from the pilot position. Therefore, an exponential weight $\exp(-\alpha k)$ for a symbol distance k from the nearest pilot position is multiplied by the LLR. Here, an index $\alpha$ is appropriately set in accordance with an actual communication system.

(B-2) Markov Transition Correlation Weight Correction

The LLR is corrected with more precision by using the Markov transition probability. As indicated in the above-mentioned expression (10), a correlation between the phase slip states spaced apart by k symbols is given as follows.

$$q_{0,0}^{[k]} - q_{2,0}^{[k]}$$ [Math. 45]

As this correlation value becomes smaller, a certainty factor of achieving the in-phase state becomes lower, and hence a correlation function weight for the symbol distance k from the nearest pilot is multiplied by the LLR.

(B-3) Phase Soft-Decision Weight Correction

The methods (B-1) and (B-2) described above are methods of lowering the likelihood of an information symbol spaced apart from the pilot position, but do not take into consideration the possibility that an error occurs in the phase estimated in STEP 21. A soft-decision output of the phase estimated value can be approximately obtained from the error of the estimated value.

However, when the maximum likelihood sequence estimation of (A-3) is performed, a more precise soft-decision value can be obtained by using a soft-decision output Viterbi algorithm. Therefore, the multiplication is performed by an index weight (B-1) or a correlation weight (B-2) and then by an absolute value of the soft-decision value of the most neighboring pilot.

(C) Regarding STEP 23: the error correction decoding processing performed by the LDPC decoding unit 24

After an LLR input to a decoder is corrected in STEP 22, the same decoding as STEP 11 (A-2) of the first embodiment described above is performed.

(D) Regarding STEP 24: the phase detection update processing using the hard-decision value performed by the phase error detection/correction unit 25

After the hard-decision value of the information symbol is obtained in STEP 22, re-estimation of the phase slip state can be performed by using not only the known pilot signal but also the information symbol interval as the pilot signal. In other words, the pilot insertion interval K is set to 1, and STEP 21 to STEP 24 are iterated a defined number of times or until the parity check is passed.

Figure 8:
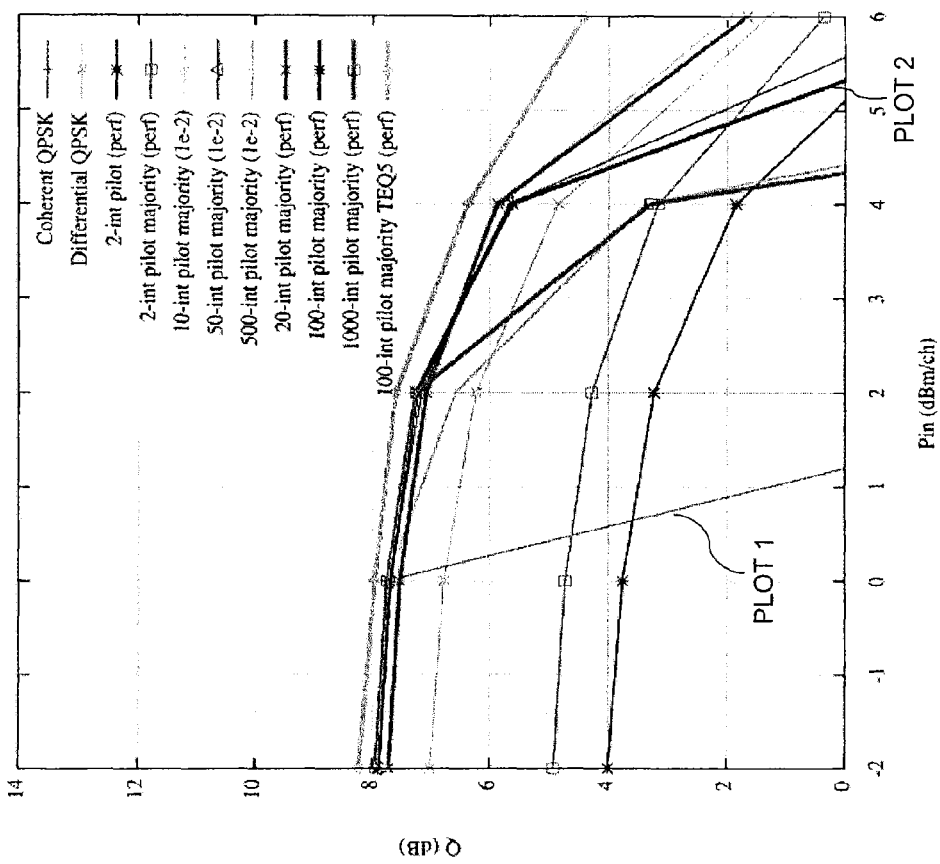
FIG. 8 is a graph showing Q-value characteristics before decoding of a majority decision phase estimation method according to a second embodiment of the present invention.

FIG. 8 is a graph showing Q-value characteristics before decoding of a majority decision phase estimation method (A-1) performed in STEP 21 according to the second embodiment of the present invention. In an optical communication propagation path that is wavelength-multiplexed, an increase in input power increases a nonlinear shift and the phase noise, and a Q-value deteriorates. Without use of the pilot signal or the differential modulation, the phase slip frequently occurs with an input power of 0 dBm or more, and the characteristics become extremely worse than the differential modulation (see "Plot 1" in FIG. 8). In contrast, when the insertion interval for the pilot signal is set to approximately 100 symbols, the characteristics can be made better than the differential modulation even with as high the power as 4 dBm by majority decision phase estimation (see "Plot 2" in FIG. 8).

Figure 9:
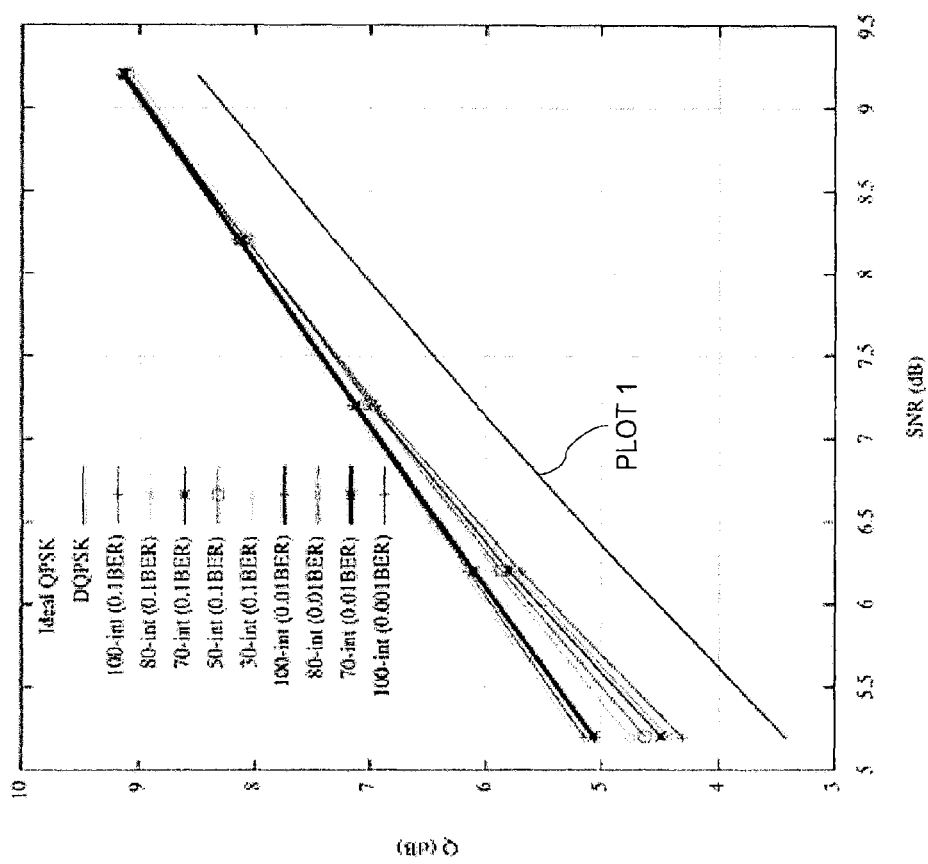
FIG. 9 is a graph showing Q-value characteristics before decoding of a maximum likelihood sequence phase estimation method according to the second embodiment of the present invention.

FIG. 9 is a graph showing Q-value characteristics before decoding of a maximum likelihood sequence phase estimation method (A-3) according to the second embodiment of the present invention. It is assumed that the phase slip occurs with a probability of 1/10 of the BER under an AWGN environment. At this time, it is understood that the characteristics are superior to the differential modulation even at an SNR of 5.2 dB close to a Shannon limit (see "Plot 1" in FIG. 9).

Figure 10:
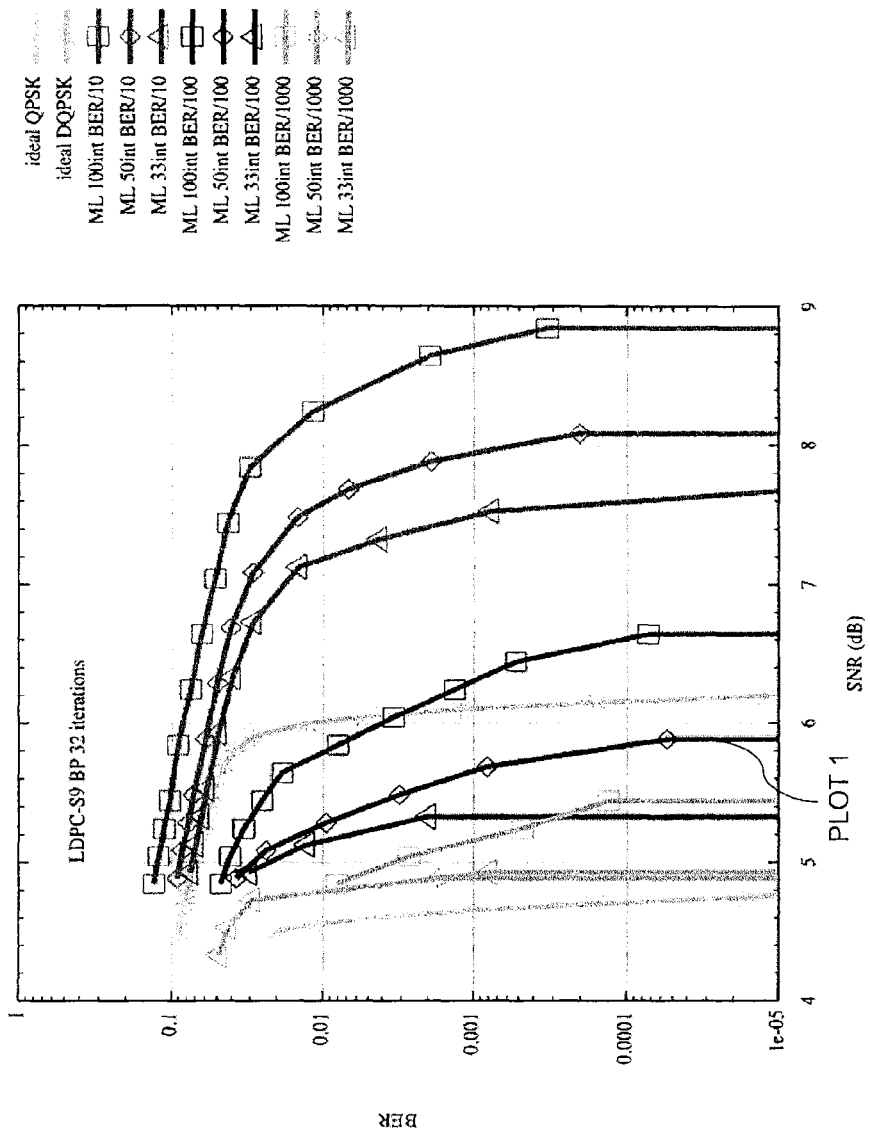
FIG. 10 is a graph showing BER characteristics obtained by performing likelihood rotation and the LDPC decoding after applying the maximum likelihood sequence phase estimation method according to the second embodiment of the present invention.

FIG. 10 is a graph showing BER characteristics obtained by performing likelihood rotation and the LDPC decoding after applying the maximum likelihood sequence phase estimation method (A-3) according to the second embodiment of the present invention. It is assumed that the phase slip occurs with a probability of 1/10 to 1/1000 of the BER under the AWGN environment. In regard to the BER after the LDPC decoding, it is understood that the characteristics are superior to related-art differential decoding when the pilot insertion interval is set to approximately 50 with a phase slip frequency being approximately 1/100 of the BER (see "Plot 1" in FIG. 10). In addition, by iterating the estimation, it is possible to suppress the deterioration in the characteristics in the same manner as in the first embodiment described above.

As described above, according to the second embodiment, by employing such a high-accuracy phase slip detection method as indicated by the three kinds of specific example, the high-accuracy phase slip detection can be performed in consideration of the slip probability based on a phase compensator.

Third Embodiment

In this third embodiment, a description is made of a simultaneous estimation method for the phase slip and the transmission data in consideration of the slip probability of the phase compensation unit 22 by using soft-decision feedback information on the FEC. In the first and second embodiments described above, initial phase estimation is performed only in the position in which the known pilot signal is inserted, and the re-estimation is performed by using a hard-decision result of the decoding, which can improve the characteristics. The characteristics can be further improved when it is possible to simultaneously perform the estimation of a data sequence of the information symbol interval and the estimation of the phase slip state.

Therefore, a process including the following three steps A to C is executed in a method according to this third embodiment.

(A) STEP 31: Simultaneous phase/data estimation processing performed by the likelihood correction unit 23

(B) STEP 32: LDPC decoding processing performed by the LDPC decoding unit 24

(C) STEP 33: Iterative processing for a soft-decision value performed by the phase error detection/correction unit 25

Next, the respective steps are described in detail.

(A) Regarding STEP 31: the simultaneous phase/data estimation processing performed by the likelihood correction unit 23

Here, the same definition as a maximum likelihood sequence estimation method (A-3) according to the second embodiment described above is followed. In regard to a data symbol sequence in which the pilot signal is inserted, the same sequence likelihood as the above-mentioned expression (11) is assumed. However, in this third embodiment, a simultaneous posterior probability of a phase state sequence and the data sequence obtained when the received signal is given is maximized. In other words, a logarithmic posterior probability is given by the following expression.

[Math. 46]

$$\ln Pr(s,u|y) = C + \sum_k \{\ln Pr(y_k|s_k, u_{2k-1}, u_{2k}) + \ln Pr(s_k|s_{k-1}) + \ln Pr(u_{2k-1}) + \ln Pr(u_{2k})\}$$

$$= C' + \sum_k \left\{ -\frac{1}{2\sigma_0^2}\left|y_k - \exp\left(j\frac{\pi}{2}s_k\right)\cdot(u_{2k-1} + j\cdot u_{2k})\right|^2 + \ln q_{s_k,s_{k-1}}^{[1]} + \frac{u_{2k-1}L_u^I(u_{2k-1})}{2} + \frac{u_{2k}L_u^I(u_{2k})}{2} \right\}$$

Here, C and C' are fixed values that do not depend on an estimated sequence. Further, a phase state sequence s, a transmission sequence u, and a received sequence y all include both intervals of the pilot symbol and an encoded symbol. In an initial state before the soft-decision output from the decoder is obtained, prior information LLR of the information symbol interval is 0. On the other hand, prior information in a pilot insertion position is known, and is therefore infinite.

To search for a maximum posterior probability described above in the same manner as the maximum likelihood sequence estimation method (A-3) according to the second embodiment described above, it is convenient to write it down as the 4-state trellis diagram based on the Markov model. A major difference from the above-mentioned maximum likelihood sequence estimation method resides in that searches for the phase state sequence s and the transmission sequence u are simultaneously performed and that the prior information on a transmission sequence is used.

At this time, the 4-state trellis diagram includes 16×4=64 transitions in total obtained by combining 4×4=16 branches of the phase state and 4 branches of a transmission symbol. Along this trellis diagram, by using Log-MAP, Max-Log-MAP, the soft-decision output Viterbi algorithm, or the like, it is possible for all branches to integrate a logarithmic probability as in the above-mentioned expression and simultaneously perform the estimation of the phase state and data over the entire sequence.

(B) Regarding STEP 32: the LDPC decoding processing performed by the LDPC decoding unit 24

After the LLR for an encoded data sequence u is generated by STEP 31, the decoding is executed in the same manner as in the first and second embodiments described above.

(C) Regarding STEP 33: the iterative processing for the soft-decision value performed by the phase error detection/correction unit 25

When an error is recognized in the parity check in STEP 32, or until a defined number of iterations is reached, the soft-decision output of the decoding is fed back to a maximum posterior probability simultaneous estimator in STEP 31, and the process up to STEP 33 is iterated. In the first and second embodiments described above, a hard-decision output of a decoding result is used at the time of iteration, but in this method, an external value of the soft-decision output is used at the time of iteration.

In other words, external information obtained by subtracting an input LLR to the decoder from a posterior LLR output of the LDPC decoding unit 24 is fed back to a simultaneous estimator as a prior value. In the same manner, external information obtained by subtracting the posterior LLR that is an output of the simultaneous estimator from the input LLR is newly input to the decoder. In this case, the LDPC decoding unit 24 can enhance an iteration gain by holding the certainty factor obtained by propagation so far.

Figure 11:
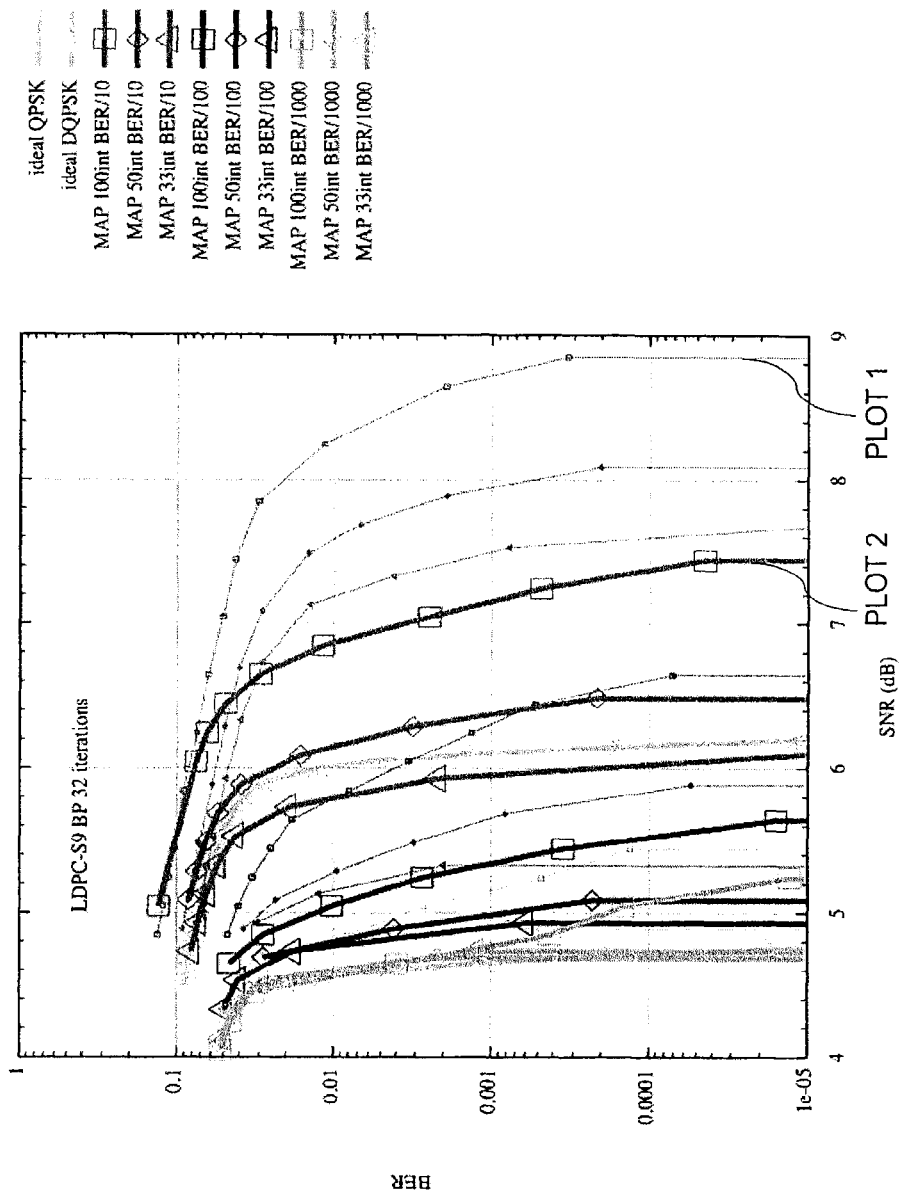
FIG. 11 is a graph showing initial BER characteristics of a proposition estimator before decision feedback from FEC is performed according to a third embodiment of the present invention.

FIG. 11 is a graph showing initial BER characteristics of a proposition estimator before decision feedback from the FEC is performed according to the third embodiment of the present invention. The LLR is automatically corrected by simultaneously estimating the phase slip and the data (see, as an example, "Plot 1" in FIG. 11), and hence it is understood that the characteristics are further improved by approximately 1.5 dB than in the maximum likelihood sequence phase estimation method using only the pilot symbol (see, as an example, "Plot 2" in FIG. 11).

Figure 12:
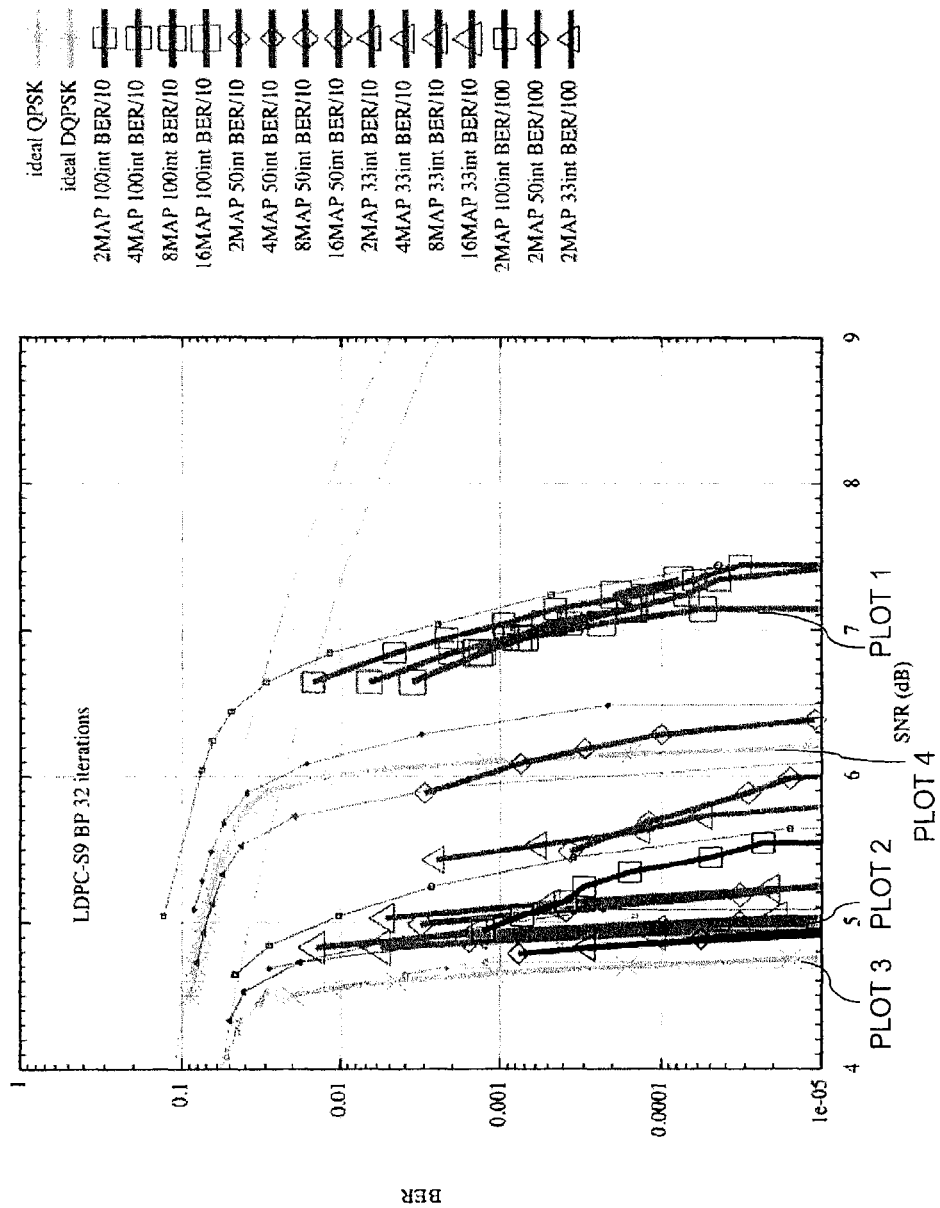
FIG. 12 is a graph showing characteristic gains obtained by iterative processing according to the third embodiment of the present invention.

FIG. 12 is a graph showing characteristic gains obtained by the iterative processing according to the third embodiment of the present invention. Only an improvement effect of approximately 0.3 dB is produced in the pilot insertion at 100-symbol intervals (see, as an example, "Plot 1" in FIG. 12), but a remarkable improvement is observed in the pilot insertion at 50-symbol intervals (see, as an example, "Plot 2" in FIG. 12).

When 16 iterations are performed (see, as an example, "Plot 2" in FIG. 12), it is possible to suppress the deterioration to a drop by 0.3 dB from such ideal characteristics (see, as an example, "Plot 3" in FIG. 12) that no phase slip occurs, and to realize the performance superior to a related-art differential modulation method (see, as an example, "Plot 4" in FIG. 12) by approximately 1 dB.

As described above, according to the third embodiment, by using the soft-decision feedback information on the FEC, it is possible to realize simultaneous estimation of the phase slip and the transmission data in consideration of the slip probability of a phase compensation unit. As a result, it is possible to obtain the performance superior in noise immunity to the related-art differential modulation method.

Fourth Embodiment

In this fourth embodiment, a description is made of a method of performing the simultaneous estimation of the phase slip and the transmission data by using not only the soft-decision feedback information on the FEC but also a compensation amount signal from the phase compensation unit 22. When generating a signal $y_k$, the related-art phase compensation unit illustrated in FIG. 14 performs phase rotation compensation of:

$$\exp(-\hat{\phi}_k).\quad [\text{Math. 47}]$$

In contrast, in this fourth embodiment, by also inputting a compensation amount thereof to a simultaneous phase estimator, it is possible to further improve estimation accuracy of the phase slip state. At this time, a simultaneous probability between a received signal sequence y and a phase compensation sequence:

$$\hat{\phi}\quad [\text{Math. 48}]$$

is used. Further, by statistically analyzing the simultaneous probability between the phase compensation sequence:

$$\hat{\phi}\quad [\text{Math. 49}]$$

and a phase slip probability, it is possible to build a time-varying Markov model.

As described above, according to the fourth embodiment, by using the compensation amount signal from the phase compensation unit in addition to the soft-decision feedback information on the FEC, it is possible to realize the simultaneous estimation of the phase slip and the transmission data in consideration of the slip probability of the phase compensation unit. As a result, it is possible to further improve the estimation accuracy of the phase slip state.

Fifth Embodiment

The simultaneous estimation method for the phase slip and the transmission data according to the third and fourth embodiments described above can also be applied to the differential modulation method. When the differential modulation is used in order to alleviate the influence of the phase slip, the characteristics deteriorate due to the differential detection and the differential synchronous detection.

When the differential modulation method is used, the deterioration in the characteristics can be suppressed by feeding back the soft-decision information on the FEC, but a related-art method does not take the actual phase slip state into consideration. In contrast, by using the invention of the simultaneous estimation according to these third and fourth embodiments for iterative estimation in the differential modulation method, the characteristics can be improved more greatly than in a case where a phase slip state sequence is not taken into consideration.

Figure 13:
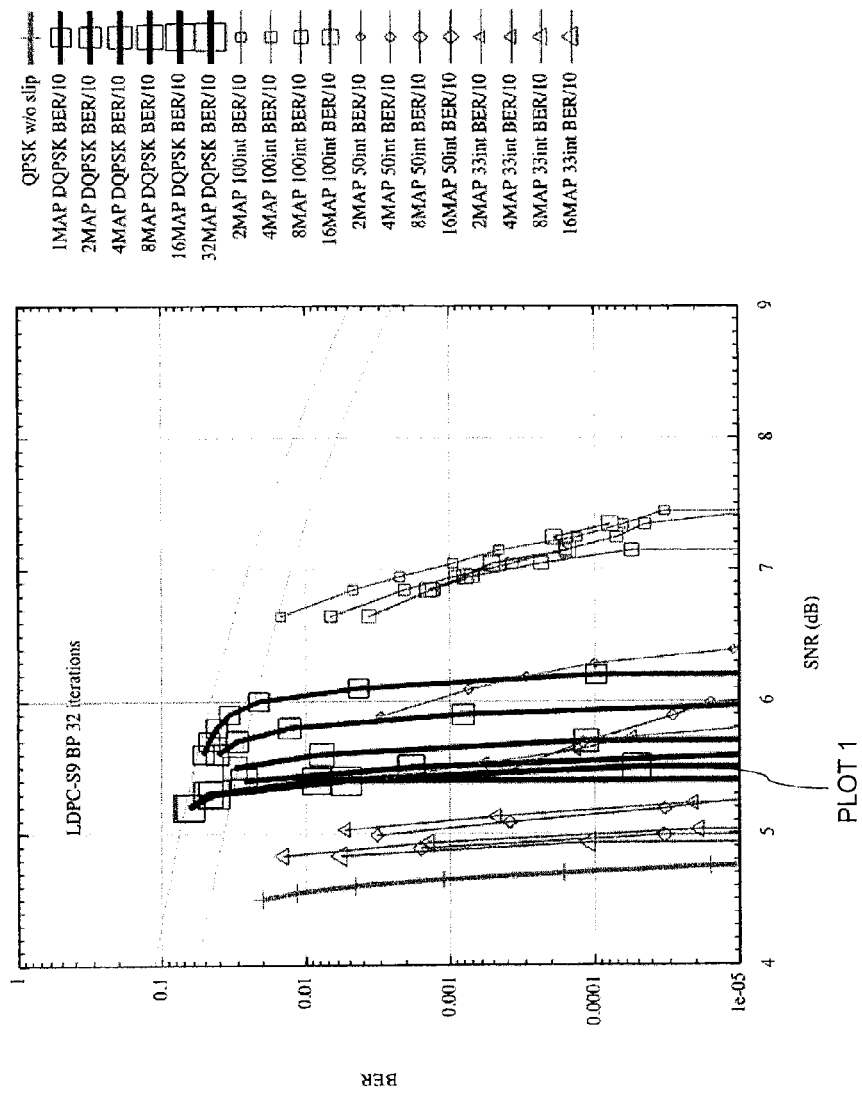
FIG. 13 is a graph showing BER characteristics of a simultaneous estimation method according to a fifth embodiment of the present invention.

FIG. 13 is a graph showing BER characteristics of the simultaneous estimation method according to a fifth embodiment of the present invention. It is understood that a method proposed in this fifth embodiment (see, as an example, "Plot 4" of FIG. 12 for "Plot 1" in FIG. 13) realizes an improvement of approximately 0.8 dB by the 16 iterations.

As described above, according to the fifth embodiment, by using the present invention for the iterative estimation in the differential modulation method, the characteristics can be improved more greatly than in the case where the phase slip state sequence is not taken into consideration.

Note that, the communication device according to the present invention can be mounted to any communication device such as an optical communication device, a wireless communication device, a wired communication device, or a satellite communication device.

Further, countermeasures against the phase slip are described in the above-mentioned first to fifth embodiments, but the present invention can produce the same effects regarding phase fluctuations other than that.

The invention claimed is:

1. A receiver to be used under an environment in which a phase slip or a phase fluctuation occurs, for receiving, as a received signal, a transmission signal comprising a signal formed of a plurality of pilot sequences as a part thereof and subjected to modulation after error correction coding, the receiver comprising:

a phase compensation unit that uses a Markov model to model a state in which the phase slip occurs and performs demodulation for the received signal while maintaining synchronization thereof; and an error correction decoding unit that performs decoding processing for received data that has been subjected to the demodulation, the receiver having a phase slip estimation processing function that estimates the phase slip by the phase compensation unit by using the plurality of pilot sequences and the Markov model, and that estimates a phase difference component by the error correction decoding unit, to thereby correct a phase of the received data.

2. A receiver according to claim 1, wherein the phase compensation unit uses a decoding method for obtaining a phase slip probability at a specific time point based on the plurality of pilot sequences in accordance with a state transition probability of the Markov model, to thereby execute the phase slip estimation processing function.

3. A receiver according to claim 2, wherein the phase compensation unit uses a maximum-likelihood decoding method based on Viterbi decoding or a minimum mean squared error method as an algorithm for the phase slip estimation processing function using the Markov model.

4. A receiver according to claim 3, wherein the error correction decoding unit estimates the phase difference component based on decision information output after decoding or during the decoding by using hard-decision iterative decoding or soft-decision iterative decoding for an error correction code, and corrects the phase of the received data based on the estimated phase difference component, to thereby execute the phase slip estimation processing function.

5. A receiver according to claim 4, wherein:
the error correction decoding unit generates any one of hard-decision information and soft-decision information as a result of performing the decoding processing; and
the phase compensation unit employs the decision information generated by the error correction decoding unit as a prior value, and executes an algorithm for the phase slip estimation processing function using the Markov model.

6. A receiver according to claim 5, wherein the error correction decoding unit decodes the received signal by executing:
first iterative processing of executing the decoding processing X times set in advance, where X is an integer equal to or greater than 1, to thereby generate the decision information;
second iterative processing of executing the phase slip estimation processing function using the Markov model based on the decision information generated by the first iterative processing, to thereby generate the received data that has been subjected to correction based on the phase difference component, and using the generated received data to re-execute the first iterative processing Y times set in advance, where Y is an integer equal to or greater than 1; and
third iterative processing of executing the decoding processing Z times set in advance, where Z is an integer equal to or greater than 1, for the received data that has been subjected to the correction based on the phase difference component, which is generated by the second iterative processing for the Y-th time, after the second iterative processing is finished the Y times.

7. A receiver according to claim 2, wherein the error correction decoding unit estimates the phase difference component based on decision information output after decoding or during the decoding by using hard-decision iterative decoding or soft-decision iterative decoding for an error correction code, and corrects the phase of the received data based on the estimated phase difference component, to thereby execute the phase slip estimation processing function.

8. A receiver according to claim 7, wherein:
the error correction decoding unit generates any one of hard-decision information and soft-decision information as a result of performing the decoding processing; and
the phase compensation unit employs the decision information generated by the error correction decoding unit as a prior value, and executes an algorithm for the phase slip estimation processing function using the Markov model.

9. A receiver according to claim 8, wherein the error correction decoding unit decodes the received signal by executing:
first iterative processing of executing the decoding processing X times set in advance, where X is an integer equal to or greater than 1, to thereby generate the decision information;
second iterative processing of executing the phase slip estimation processing function using the Markov model based on the decision information generated by the first iterative processing, to thereby generate the received data that has been subjected to correction based on the phase difference component, and using the generated received data to re-execute the first iterative processing Y times set in advance, where Y is an integer equal to or greater than 1; and
third iterative processing of executing the decoding processing Z times set in advance, where Z is an integer equal to or greater than 1, for the received data that has been subjected to the correction based on the phase difference component, which is generated by the second iterative processing for the Y-th time, after the second iterative processing is finished the Y times.

10. A receiver according to claim 1, wherein the error correction decoding unit estimates the phase difference component based on decision information output after decoding or during the decoding by using hard-decision iterative decoding or soft-decision iterative decoding for an error correction code, and corrects the phase of the received data based on the estimated phase difference component, to thereby execute the phase slip estimation processing function.

11. A receiver according to claim 10, wherein the error correction decoding unit uses any one of hard-decision information and soft-decision information generated as a result of performing the decoding processing to detect a phase difference between the received signal and a modulated wave reproduced from the decision information obtained after the decoding, uses a filter to estimate the phase difference component from the phase difference obtained after reducing dispersion of the phase difference component due to noise within a communication channel for receiving the transmission signal, detects estimated phase differences of +90°, −90°, and +180° by providing a threshold value to the estimated phase difference component, and corrects the phase of the received data in a direction reverse to the detected estimated phase difference, to thereby execute the phase slip estimation processing function.

12. A receiver according to claim 11, wherein the filter obtains a mean value of the phase difference between the received signal formed of a plurality of consecutive symbols and the modulated wave reproduced from the decision information, to thereby calculate the phase difference obtained after reducing the dispersion of the phase difference component due to the noise within the communication channel.

13. A receiver according to claim 12, wherein the error correction decoding unit decodes the received signal by executing:
- first iterative processing of executing the decoding processing X times set in advance, where X is an integer equal to or greater than 1, to thereby generate the decision information;
- second iterative processing of executing the phase slip estimation processing function based on the decision information generated by the first iterative processing, to thereby generate the received data that has been subjected to correction based on the phase difference component, and using the generated received data to re-execute the first iterative processing Y times set in advance, where Y is an integer equal to or greater than 1; and
- third iterative processing of executing the decoding processing Z times set in advance, where Z is an integer equal to or greater than 1 for the received data that has been subjected to the correction based on the phase difference component, which is generated by the second iterative processing for the Y-th time, after the second iterative processing is finished the Y times.

14. A receiver according to claim 11, wherein the error correction decoding unit decodes the received signal by executing:
- first iterative processing of executing the decoding processing X times set in advance, where X is an integer equal to or greater than 1, to thereby generate the decision information;
- second iterative processing of executing the phase slip estimation processing function based on the decision information generated by the first iterative processing, to thereby generate the received data that has been subjected to correction based on the phase difference component, and using the generated received data to re-execute the first iterative processing Y times set in advance, where Y is an integer equal to or greater than 1; and
- third iterative processing of executing the decoding processing Z times set in advance, where Z is an integer equal to or greater than 1 for the received data that has been subjected to the correction based on the phase difference component, which is generated by the second iterative processing for the Y-th time, after the second iterative processing is finished the Y times.

15. A receiver according to claim 10, wherein the error correction decoding unit decodes the received signal by executing:
- first iterative processing of executing the decoding processing X times set in advance, where X is an integer equal to or greater than 1, to thereby generate the decision information;
- second iterative processing of executing the phase slip estimation processing function based on the decision information generated by the first iterative processing, to thereby generate the received data that has been subjected to correction based on the phase difference component, and using the generated received data to re-execute the first iterative processing Y times set in advance, where Y is an integer equal to or greater than 1; and
- third iterative processing of executing the decoding processing Z times set in advance, where Z is an integer equal to or greater than 1 for the received data that has been subjected to the correction based on the phase difference component, which is generated by the second iterative processing for the Y-th time, after the second iterative processing is finished the Y times.

16. A communication method, which is employed for a communication device to be used under an environment in which a phase slip or a phase fluctuation occurs,
the communication device including
a transmitter that transmits a transmission signal subjected to modulation after error correction coding, and
a receiver including
a phase compensation unit that receives the transmission signal transmitted from the transmitter as a received signal, and performs demodulation therefor while maintaining synchronization thereof, and
an error correction decoding unit that performs decoding processing for received data that has been subjected to the demodulation,
the communication method comprising:
- transmitting, by the transmitter, a signal formed of a plurality of pilot sequences as a part of the transmission signal; and
- estimating, by the receiver, a phase difference component based on decision information output after decoding or during the decoding by using the plurality of pilot sequences and a Markov model included in the phase compensation unit to model a state in which the phase slip occurs and using hard-decision iterative decoding or soft-decision iterative decoding for an error correction code, and executing a phase slip estimation processing function for correcting a phase of the received data based on the estimated phase difference component.

* * * * *